(12) United States Patent
Nakatani et al.

(10) Patent No.: US 7,324,791 B2
(45) Date of Patent: Jan. 29, 2008

(54) LOW-NOISE DIFFERENTIAL BIAS CIRCUIT AND DIFFERENTIAL SIGNAL PROCESSING APPARATUS

(75) Inventors: Toshifumi Nakatani, Sakai (JP); Shinichi Osako, Takatsuki (JP); Jyunji Itoh, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 448 days.

(21) Appl. No.: 11/038,415

(22) Filed: Jan. 21, 2005

(65) Prior Publication Data

US 2005/0164649 A1 Jul. 28, 2005

(30) Foreign Application Priority Data

Jan. 23, 2004 (JP) ............................. 2004-016089

(51) Int. Cl.
 *H04B 1/40* (2006.01)
(52) U.S. Cl. .................. 455/84; 455/73; 455/63.1; 455/39; 455/91; 455/333; 455/323; 455/326; 455/501; 455/500
(58) Field of Classification Search ................ 455/73, 455/84, 63.1, 39, 91, 333
See application file for complete search history.

(56) References Cited

U.S. PATENT DOCUMENTS

| | | | | |
|---|---|---|---|---|
| 5,488,330 A | * | 1/1996 | Masuoka et al. | 330/261 |
| 5,973,539 A | * | 10/1999 | Komurasaki et al. | 327/359 |
| 6,255,889 B1 | * | 7/2001 | Branson | 327/359 |
| 6,342,804 B1 | * | 1/2002 | Havens et al. | 327/357 |
| 6,392,492 B1 | * | 5/2002 | Yuan | 330/311 |
| 6,396,330 B1 | * | 5/2002 | Fujii | 327/355 |
| 6,404,263 B1 | * | 6/2002 | Wang | 327/359 |

(Continued)

FOREIGN PATENT DOCUMENTS

EP 1 398 873 3/2004

(Continued)

OTHER PUBLICATIONS

Hung et al., Juo-Jung, "A High-Efficiency Miniaturized SiGe Ku-Band Balanced Frequency Doubler", University of Michigan, IEEE, 2004.

(Continued)

*Primary Examiner*—Lana Le
*Assistant Examiner*—Amar Daglawi
(74) *Attorney, Agent, or Firm*—Wenderoth, Lind & Ponack, L.L.P.

(57) ABSTRACT

A low-noise differential bias circuit is provided which obtains excellent noise characteristics while ensuring excellent distortion characteristics. A collector of a transistor Q11 is connected to a voltage supply point (Vcc) via a resistor R15. A base of the transistor Q11 is connected to a base of a transistor Q1 via resistors R13, R11 connected in series. A connection point between the resistors R11, R13 is connected to the collector of the transistor Q11. A collector of a transistor Q12 is connected to the voltage supply point at connection point A via a resistor R16. A base of the transistor Q12 is connected to a base of a transistor Q2 via resistors R14, R12 connected in series. A connection point between the resistors R12, R14 is connected to the collector of the transistor Q12. By this configuration, a high frequency ground is performed at the connection point A.

29 Claims, 24 Drawing Sheets

U.S. PATENT DOCUMENTS

| | | | |
|---|---|---|---|
| 6,437,631 B2* | 8/2002 | Amano | 327/359 |
| 6,768,379 B2* | 7/2004 | Umeda et al. | 330/261 |
| 2002/0193089 A1* | 12/2002 | Hatcher et al. | 455/326 |
| 2003/0141928 A1* | 7/2003 | Lee | 330/252 |
| 2003/0223287 A1* | 12/2003 | Sharifi et al. | 365/200 |
| 2004/0008085 A1 | 1/2004 | Khaw et al. | |
| 2004/0085101 A1* | 5/2004 | Pellat et al. | 327/113 |
| 2004/0257152 A1* | 12/2004 | Kwok | 327/552 |
| 2005/0062540 A1* | 3/2005 | Nakatani et al. | 330/294 |

FOREIGN PATENT DOCUMENTS

| | | |
|---|---|---|
| JP | 2003-133862 | 5/2003 |
| JP | 2003-198260 | 7/2003 |
| JP | 2003-209446 | 7/2003 |
| WO | 03/084054 | 10/2003 |

OTHER PUBLICATIONS

Doan et al., Chinh H., "60 Ghz CMOS Radio for Gb/s Wireless LAN", University of California, IEEE, 2004.

Manku et al., T., "A Single Chip Direct Conversion CMOS Tranceiver for Quad-band GSM/GPRS/EDGE and WLAN with integrated VCO's and Fractional-N Synthesizer", Sirfic Wireless Corporation, IEEE, 2004.

Zoeschg, D. et al.: "Monolithic Low-Noise Amplifiers Up To 10GHz in Silicon and SiGe Bipolar Technologies" 30th European Microwave Conference Proceedings. Paris, Oct. 3-5, 2000, Proceedings of the European Microwave Conference, London: CMP, GB, vol. 1 of 3 Conf. 30, pp. 332-335, XP001060761.

* cited by examiner

LOW-NOISE DIFFERENTIAL BIAS CIRCUIT AND DIFFERENTIAL SIGNAL PROCESSING APPARATUS

BACKGROUND OF THE INVENTION

1. Field of the Invention

The present invention relates to a low-noise differential bias circuit and a differential signal processing apparatus. More particularly, the present invention relates to a low-noise differential bias circuit for supplying a low-noise direct-current voltage to transistors having a differential configuration, and a differential signal processing apparatus using such a bias circuit.

2. Description of the Related Art

With a rapid increase in the use of wireless communication apparatuses such as mobile phones, there is an increasing need for miniaturization of the functioning section (radio circuit section) where a radio signal is processed. Thus, in the wireless communication apparatus field, the recent trend is to fabricate the radio circuit section into an integrated circuit (IC). To do so, it is necessary to fabricate an amplifier, an oscillator, etc., which are conventionally fabricated as separate individual components or modules, into an IC.

FIGS. 23 and 24 are diagrams illustrating circuit configurations of conventional differential signal processing apparatuses (differential amplification apparatuses) (see Japanese Laid-Open Patent Publications No. 2003-133862 and No. 2003-209446).

A conventional differential signal processing apparatus 501 shown in FIG. 23 is composed of a bias circuit 511 and a differential amplification circuit 521. The bias circuit 511 includes resistors R111 to R114 and an NPN bipolar transistor Q111. The differential amplification circuit 521 includes NPN bipolar transistors Q1 to Q4 and a bias circuit b.

In the differential amplification circuit 521, differential signals (IN) are inputted to the bases of the transistors Q1 and Q2, respectively. In addition, a predetermined bias current is supplied to the base of each of the transistors Q1 and Q2 by the bias circuit 511. The emitters of the transistors Q1 and Q2 are both grounded. The emitters of the transistors Q3 and Q4 are connected to the collectors of the transistors Q1 and Q2, respectively. A predetermined potential is supplied to the base of each of the transistors Q3 and Q4 by the bias circuit b.

In the bias circuit 511, the collector of the transistor Q111 is connected to a voltage supply point (Vcc) via the resistor R114. The base of the transistor Q111 is connected to a collector (connection point E) via the resistor R113. The collector (connection point E) of the transistor Q111 is connected to both the base of the transistor Q1 of the differential amplification circuit 521 via the resistor R111, and the base of the transistor Q2 of the differential amplification circuit 521 via the resistor R112. The emitter of the transistor Q111 is grounded.

A conventional differential signal processing apparatus 502 shown in FIG. 24 is composed of a bias circuit 512 and a differential amplification circuit 521. The bias circuit 512 includes resistors R111 and R112, NPN bipolar transistors Q111 and Q112, and bypass capacitors C111 and C112. The differential amplification circuit 521 is the same as that described above.

The collector of the transistor Q111 is connected to a voltage supply point (Vcc) and the emitter of the transistor Q111 is grounded through the bypass capacitor C111. The collector of the transistor Q112 is connected to the voltage supply point (Vcc) and the emitter of the transistor Q112 is grounded through the bypass capacitor C112. A predetermined reference voltage (Vref) is supplied to the base of each of the transistors Q111 and Q112. The emitter of the transistor Q111 is connected to the base of the transistor Q1 of the differential amplification circuit 521 via the resistor R111. The emitter of the transistor Q112 is connected to the base of the transistor Q2 of the differential amplification circuit 521 via the resistor R112.

By the above-described configurations, the conventional differential signal processing apparatuses 501 and 502 amplify differential signals inputted to the bases of the transistors Q1 and Q2, and then output the amplified signals (OUT) from the collectors of the transistors Q3 and Q4.

The bias circuits 511 and 512 used in the conventional differential signal processing apparatuses 501 and 502 are generally suitable for use in circuits which handle low-frequency signals. Thus, if the bias circuits 511 and 512 are used as they are in circuits which handle high-frequency signals, in particular, in radio circuits which require low noise, the following problems occur.

In the conventional differential signal processing apparatus 501, since the differential signals inputted to the bases of the transistors Q1 and Q2 are canceled at the connection point E through the resistors R111 and R112, the connection point E can be considered as an imaginary high-frequency ground point. However, because of the imaginary ground, if the values of the resistors R111 and R112 are low, a noise component easily flows into the bases of the transistors Q1 and Q2 from the connection point E, degrading noise characteristics. On the other hand, if the values of the resistors R111 and R112 are high, distortion characteristics are degraded due to nonlinearity of input and output signals. Since the allowable voltage drop in the resistors R111 and R112 is determined by the voltage of the voltage supply point, the values of the resistors R111 and R112 cannot be made very high.

In the conventional differential signal processing apparatus 502, the differential signal inputted to the base of the transistor Q1 is grounded through the resistor R111 and the capacitor C111, and the differential signal inputted to the base of the transistor Q2 is grounded through the resistor R112 and the capacitor C112. Therefore, the emitters (connection points F) of the transistors Q111 and Q112 can be considered as imaginary high-frequency ground points. Thus, as in the above-described differential signal processing apparatus 501, if the values of the resistors R111 and R112 are low, noise characteristics are degraded, and if the values of the resistors R111 and R112 are high, distortion characteristics are degraded. Further, since the differential signal processing apparatus 502 includes therein the capacitors C111 and C112, the chip area increases when the differential signal processing apparatus 502 is fabricated into an IC.

As described above, since there is a tradeoff relationship between noise characteristics and distortion characteristics, the bias circuits 511 and 512 of the conventional differential signal processing apparatuses 501 and 502 cannot be simply applied to circuits which handle high-frequency signals. Accordingly, in the wireless communication apparatus field, there is a need to design a novel low-noise bias circuit for high-frequency signals which has excellent noise characteristics and excellent distortion characteristics.

SUMMARY OF THE INVENTION

Therefore, an object of the present invention is to provide a low-noise differential bias circuit which reduces loss caused by the resistors of the bias circuit, and which obtains excellent noise characteristics while ensuring excellent distortion characteristics. Another object of the present invention is to provide a differential signal processing apparatus using such a bias circuit.

The present invention is directed to a low-noise differential bias circuit for supplying a low-noise bias current to bases or gates of a pair of differential transistors. To attain the object mentioned above, the low-noise differential bias circuit of the present invention comprises first to fourth resistors and first and second transistors. A direct-current voltage is supplied to a connection point between the first resistor and the third resistor, a connection point between the second resistor and the fourth resistor, a collector or drain of the first transistor, and a collector or drain of the second transistor, from a voltage supply point through a ground element.

A first end of the first resistor is connected to a base or gate of one of the pair of differential transistors. A first end of the second resistor is connected to a base or gate of the other one of the pair of differential transistors. A first end of the third resistor is connected to a second end of the first resistor. A first end of the fourth resistor is connected to a second end of the second resistor. A base or gate of the first transistor is connected to a second end of the third resistor. A second end of the fourth resistor is connected to a base or gate of the second transistor.

Typically, the ground element includes a fifth resistor connecting the connection point between the first resistor and the third resistor and the collector or drain of the first transistor to the voltage supply point. The ground element also includes a sixth resistor connecting the connection point between the second resistor and the fourth resistor and the collector or drain of the second transistor to the voltage supply point.

Alternatively, the ground element may include: a fifth resistor connecting the collector or drain of the first transistor to the voltage supply point; a sixth resistor connecting the collector or drain of the second transistor to the voltage supply point; a third transistor, a base or gate of the third transistor being connected to the collector or drain of the first transistor, and an emitter or source of the third transistor being connected to the connection point between the first resistor and the third resistor; a fourth transistor, a base or gate of the fourth transistor being connected to the collector or drain of the second transistor, and an emitter or source of the fourth transistor being connected to the connection point between the second resistor and the fourth resistor; a first capacitor connecting the collector or drain of the first transistor to an emitter or source of the first transistor; and a second capacitor connecting the collector or drain of the second transistor to an emitter or source of the second transistor.

Alternatively, the ground element may include: a fifth resistor connecting the collector or drain of the first transistor and the collector or drain of the second transistor to the voltage supply point; a third transistor, a base or gate of the third transistor being connected to the collector or drain of the first transistor, and an emitter or source of the third transistor being connected to the connection point between the first resistor and the third resistor; and a fourth transistor, a base or gate of the fourth transistor being connected to the collector or drain of the second transistor, and an emitter or source of the fourth transistor being connected to the connection point between the second resistor and the fourth resistor.

The first to fourth transistors may be selected from the group consisting of an NPN bipolar transistor and an N-channel MOS field-effect transistor. In this case, an emitter or source of each of the first and second transistors may be grounded directly or through a resistor or an inductor.

The first to fourth transistors may be selected from the group consisting of a PNP bipolar transistor and a P-channel MOS field-effect transistor. In this case, an emitter or source of each of the first and second transistors may be connected to the voltage supply point directly or via a resistor or an inductor.

In particular, in order to fully realize the advantages of the present invention, it is preferable that a connection from the ground element to the voltage supply point or a ground point be established by a signal wire.

By combining the above-described low-noise differential bias circuits with the following differential signal processing circuits for performing predetermined differential signal processing using a low-noise bias current, various differential signal processing apparatuses can be configured.

A differential signal processing circuit may include a transistor, the second end of the first resistor being connected to a base or gate of the transistor and a second transistor, the second end of the second resistor being connected to a base or gate of the second transistor, wherein an emitter or source of each of the two transistors may be grounded at high frequencies. Signals differentially inputted to the bases or gates of the two transistors may be amplified and then outputted from collectors or drains of the two transistors.

Alternatively, a differential signal processing circuit may include a transistor, the second end of the first resistor being connected to a base or gate of the transistor and a second transistor, the second end of the second resistor being connected to a base or gate of the second transistor. A collector or drain of each of the two transistors may be connected to a predetermined potential. Additionally, two transistors may perform an impedance conversion on signals differentially inputted to the bases or gates thereof, and then output the signals from emitters or sources thereof.

A differential signal processing circuit may include a transistor, the second end of the first resistor being connected to a base or gate of the transistor and a second transistor, the second end of the second resistor being connected to a base or gate of the second transistor. Emitters or sources of the two transistors may be commonly connected to each other, and the two transistors may allow a first signal to be inputted to the emitter or source thereof. Moreover, the two transmitters may allow second signals to be differentially inputted to the bases or gates thereof, mix the first and second signals, and then output the mixed signal from a collector or drain thereof. The differential signal processing circuit may further include a transistor, the second end of the first resistor being connected to a base or gate of the transistor and a second transistor, the second end of the second resistor being connected to a base or gate of the transistor. Emitters or bases of the two transistors may be commonly connected to each other, and the two transistors may allow the first signal to be inputted in reverse phase to the emitter or source thereof.

Alternatively, a differential signal processing circuit may include a transistor, the second end of the first resistor being connected to a base or gate of the transistor and a second transistor, the second end of the second resistor being connected to a base or gate of the second transistor. Moreover, the signal processing circuit may include two capacitors, one capacitor connecting the base or gate of one of the two transistors to a collector or a drain of the other one of the two transistors, and the other capacitor connecting the base or gate of the other one of the two transistors to a collector or drain of the one of the two transistors. An emitter or source of each of the two transistors may be grounded at high frequencies, and the two transistors may output oscillated differential signals from the collectors or drains thereof.

A differential signal processing circuit may include: a third transistor, the second end of the first resistor being connected to a base or gate of the third transistor; a fourth transistor, the second end of the second resistor being connected to a base or gate of the fourth transistor; a fifth transistor, a predetermined potential being connected to a base or gate of the fifth transistor, the collector or drain of the third transistor being connected to an emitter or source of the fifth transistor; and a sixth transistor, the predetermined potential being connected to a base or gate of the sixth transistor, the collector or drain of the fourth transistor being connected to an emitter or source of the sixth transistor. An emitter or source of each of the third and fourth transistors may be grounded at high frequencies, and signals differentially inputted to the bases or gates of the third and fourth transistors, respectively, may be amplified and then outputted from collectors or drains of the fifth and sixth transistors.

In the above differential signal processing circuit, the collector or drain of the fifth transistor may be connected to the base or gate of the third transistor via a first feedback circuit. Moreover, the collector or drain of the sixth transistor may be connected to the base or gate of the fourth transistor via a second feedback circuit. The first and second feedback circuits each may be a series circuit including resistors connected in series, or may be a parallel circuit including a resistor and a capacitor connected in parallel.

The above-described differential signal processing apparatuses of the present invention can be applied to a radio circuit apparatus comprising a receiving circuit and a transmitting circuit. The receiving circuit includes: a duplexer allowing use of an antenna for both transmission and reception; an oscillator; an amplifier for amplifying a receive signal to be outputted from the duplexer; and a demodulator for demodulating the amplified receive signal using a signal generated in the first oscillator. The transmitting circuit includes: an oscillator; a modulator for modulating a transmit signal using a signal generated in the oscillator; and an amplifier for amplifying the transmit signal outputted from the modulator and then outputting the amplified transmit signal to the duplexer. The radio circuit apparatus may further comprise: a coupler for extracting a part of the transmit signal outputted from the amplifier of the transmitting circuit; a level detection circuit for detecting a power level of the extracted transmit signal; and a control circuit for changing consumption currents of the amplifier, the demodulator, and the oscillator of the receiving circuit based on the detected power level. Alternatively, the radio circuit apparatus may further comprise a level detection circuit for allowing the receive signal outputted from the amplifier of the receiving circuit to be inputted thereto, and then detecting a power level of the receive signal. The radio circuit apparatus may also further comprise a control circuit for changing consumption currents of the amplifier, the demodulator, and the oscillator based on the detected power level. Alternatively, the radio circuit apparatus may further comprise a level detection circuit for allowing the receive signal outputted from the amplifier of the receiving circuit and the receive signal outputted from the demodulator to be inputted thereto, and then detecting and comparing power levels of the two receive signals. The radio circuit apparatus may also further comprise a control circuit for changing consumption currents of the amplifier, the demodulator, and the oscillator of the receiving circuit based on a power level difference obtained through the comparison of the two receive signals.

In the above-described radio circuit apparatuses, when a signal is transmitted, the amplifier, the oscillator, the modulator, and the demodulator may be controlled to concurrently control an increase or decrease in transmission power of the transmitting circuit and an increase or decrease in consumption currents of the receiving circuit. The low-noise differential bias circuit of the present invention may be used in a doubler.

By the above-described configurations, the low-noise differential bias circuits of the present invention achieve low noise by reducing loss caused by the resistors in the circuit, and thereby improve noise characteristics.

These and other objects, features, aspects and advantages of the present invention will become more apparent from the following detailed description of the present invention when taken in conjunction with the accompanying drawings.

DETAILED DESCRIPTION OF THE INVENTION

The present invention is characterized in that a low-noise differential bias circuit having excellent distortion characteristics and excellent noise characteristics is realized by employing a unique circuit configuration. The low-noise differential bias circuit can be used in combination with various conventional or novel differential signal processing circuits. The following embodiments each describe a low-noise differential bias circuit using an exemplary apparatus composed by combining the low-noise differential bias circuit with a differential signal processing circuit which functions as a differential amplifier, an impedance converter, a mixer, or an oscillator.

FIRST EMBODIMENT

Figure 1:
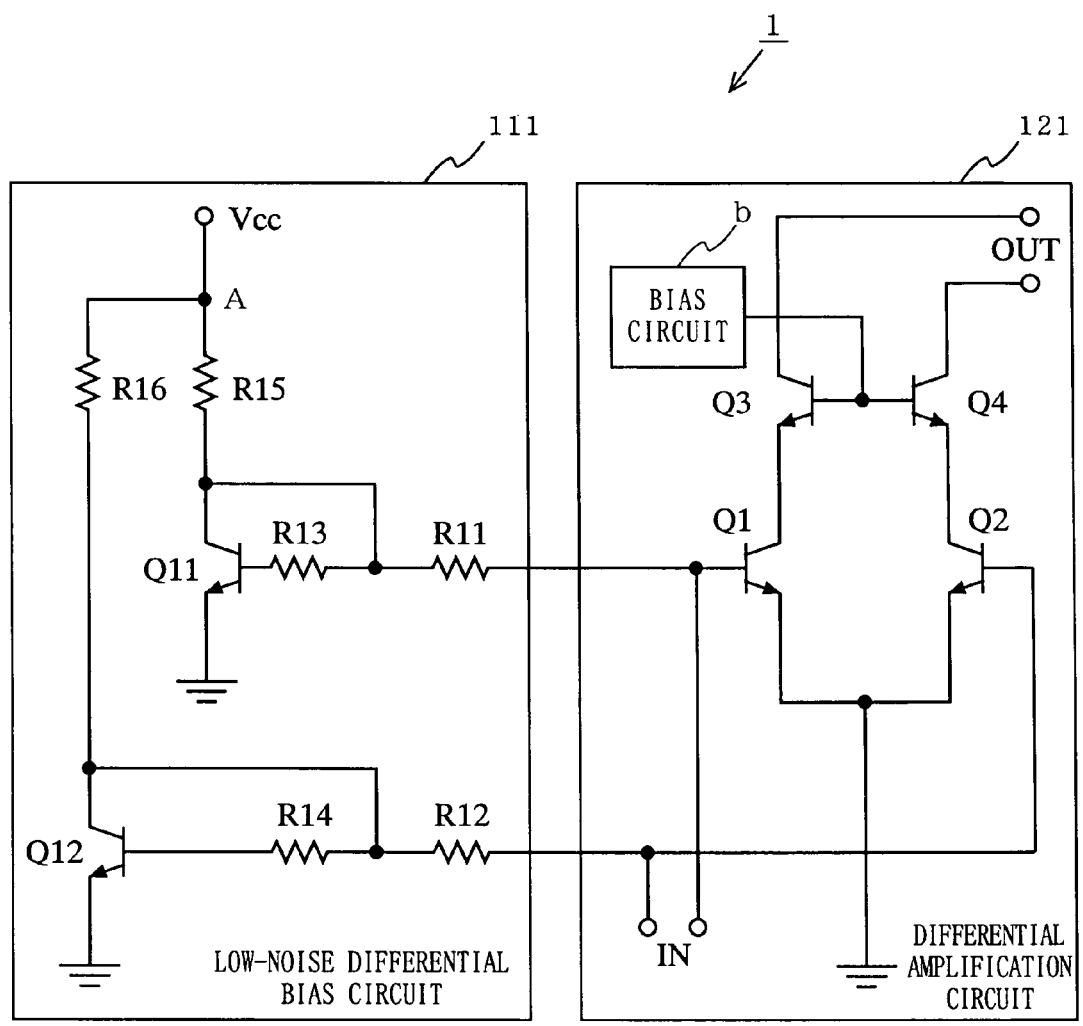
FIG. 1 is a circuit configuration diagram of a differential signal processing apparatus according to a first embodiment of the present invention.

FIG. 1 is a circuit configuration diagram of a differential signal processing apparatus 1 according to a first embodiment of the present invention. In FIG. 1, the differential signal processing apparatus 1 is composed of a low-noise differential bias circuit 111 and a differential amplification circuit 121. The low-noise differential bias circuit 111 includes resistors R11 to R16 and NPN bipolar transistors Q11 and Q12. The differential amplification circuit 121 includes NPN bipolar transistors Q1 to Q4 and a bias circuit b.

First, the configuration and operation of the low-noise differential bias circuit 111 will be described. The collector of the transistor Q11 is connected to a voltage supply point (Vcc) via the resistor R15. The base of the transistor Q11 is connected to the base of the transistor Q1 of the differential amplification circuit 121 via the resistors R13 and R11 connected in series. The connection point between the resistors R11 and R13 is connected to the collector of the transistor Q11. The emitter of the transistor Q11 is grounded. On the other hand, the collector of the transistor Q12 is connected to the voltage supply point at connection point A via the resistor R16. The connection point A is located on the symmetry axis of the differential amplification circuit 121 and thus functions as an imaginary ground (a ground element for differential signals). The base of the transistor Q12 is connected to the base of the transistor Q2 of the differential amplification circuit 121 via the resistors R14 and R12 connected in series. The connection point between the resistors R12 and R14 is connected to the collector of the transistor Q12. The emitter of the transistor Q12 is grounded.

Next, the configuration and operation of the differential amplification circuit 121 will be described. Differential signals (IN) are differentially inputted to the bases of the transistors Q1 and Q2, respectively (i.e., a single signal is inputted as an in-phase signal and an out-of-phase signal), and also a predetermined bias current is supplied to the base of each of the transistors Q1 and Q2 from the low-noise differential bias circuit 111. The emitters of the transistors Q1 and Q2 are commonly connected to each other and grounded. By the common connection, the emitters of the transistors Q1 and Q2 act as imaginary grounds, and thus the transistors Q1 and Q2 operate as the emitter-grounded amplifiers. The emitters of the transistors Q3 and Q4 are connected to the collectors of the transistors Q1 and Q2, respectively, and the signals outputted from the collectors of the transistors Q1 and Q2 are inputted to the emitters of the transistors Q3 and Q4. The bases of the transistors Q3 and Q4 are commonly connected to each other, and a predetermined bias current is supplied to the base of each of the transistors Q3 and Q4 from the bias circuit b. By the common connection, the bases of the transistors Q3 and Q4 act as imaginary grounds, and thus the transistors Q3 and Q4 operate as the base-grounded amplifiers. Then, the amplified signals (OUT) are outputted from the collectors of the transistors Q3 and Q4, respectively.

The first characteristic of the low-noise differential bias circuit 111 is that the bias section for supplying a bias current to the base of the transistor Q1 and the bias section for supplying a bias current to the base of the transistor Q2 are individually configured. The second characteristic is that a voltage is supplied to the resistors R15 and R16 through only one connection point A, and wiring from the voltage supply point to the resistor R15 and wiring from the voltage supply point to the resistor R16 are provided using a common wire. For example, in fabrication into an IC, a connection from the voltage supply line to the connection point A is established by a single wire, and the resistors R15 and R16 are wired to the connection point A so as to be branched off from the connection point A and to have as short a distance from the connection point A as possible. By this wiring, the advantage associated with the second characteristic can be fully realized.

In the differential signal processing apparatus 1 having the above-described configuration according to the first embodiment, the connection point A can be considered as an imaginary high-frequency ground point (hereinafter referred to as the "imaginary ground point") at which the differential signals inputted to the bases of the transistors Q1 and Q2 are canceled. Therefore, the resistance value between the imaginary ground point (connection point A) and the base of the transistor Q1 is increased by the resistor R15, and the resistance value between the imaginary ground point and the base of the transistor Q2 is increased by the resistor R16. Thus, according to the differential signal processing apparatus 1 of the first embodiment, desired distortion characteristics can be ensured by reducing the values of the resistors R11 and R12, and the noise characteristics can be improved compared to conventional cases because the resistance values are increased by the resistors R15 and R16. In addition, by providing wiring from the voltage supply point to the resistor R15 and wiring from the voltage supply point to the resistor R16 using a common wire, it is possible to omit a capacitor for bypassing an alternating current component, which capacitor is required when the wiring using a common wire is not provided.

SECOND EMBODIMENT

Figure 2:
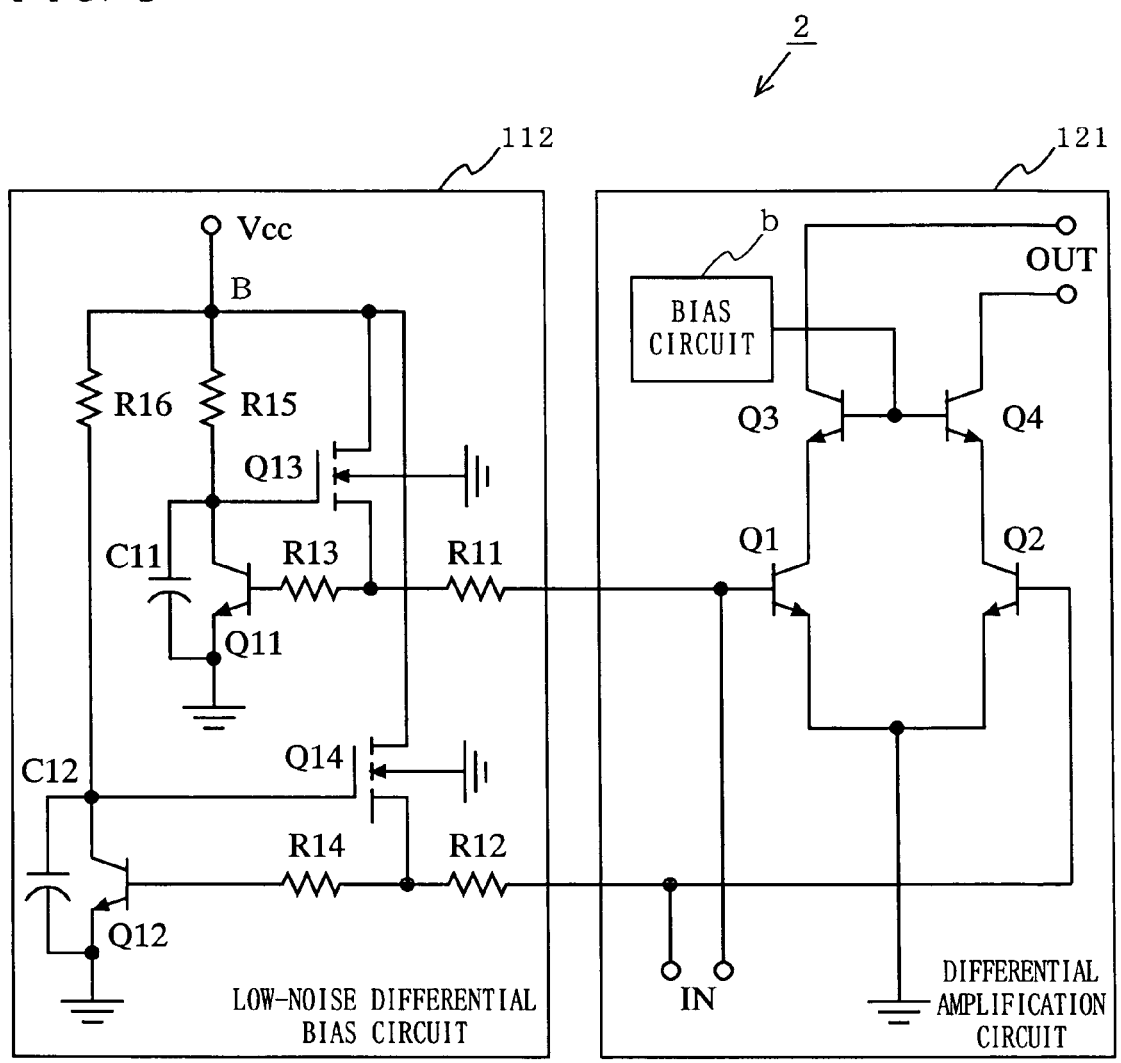
FIG. 2 is a circuit configuration diagram of a differential signal processing apparatus according to a second embodiment of the present invention.

FIG. 2 is a circuit configuration diagram of a differential signal processing apparatus 2 according to a second embodiment of the present invention. In FIG. 2, the differential signal processing apparatus 2 is composed of a low-noise differential bias circuit 112 and a differential amplification circuit 121. The low-noise differential bias circuit 112 includes resistors R11 to R16, NPN bipolar transistors Q11 and Q12, N-channel MOS field-effect transistors Q13 and Q14, and bypass capacitors C11 and C12. The differential amplification circuit 121 is the same as that described in the foregoing first embodiment.

The configuration and operation of the low-noise differential bias circuit 112 will be described. The collector of the transistor Q11 is connected to a voltage supply point (Vcc) via the resistor R15. In addition, the collector of the transistor Q11 is grounded by the bypass capacitor C11. The emitter of the transistor Q11 is grounded. The base of the transistor Q11 is connected to the base of the transistor Q1 of the differential amplification circuit 121 via the resistors R13 and R11 connected in series. The connection point between the resistors R11 and R13 is connected to the source of the transistor Q13. The gate of the transistor Q13 is connected to the collector of the transistor Q11. The drain of the transistor Q13 is connected to the voltage supply point, and the substrate of the transistor Q13 is grounded. On the other hand, the collector of the transistor Q12 is connected to the voltage supply point at connection point B via the resistor R16. In addition, the collector of the transistor Q12 is grounded by the bypass capacitor C12. The emitter of the transistor Q12 is grounded. The base of the transistor Q12 is connected to the base of the transistor Q2 of the differential amplification circuit 121 via the resistors R14 and R12 connected in series. The connection point between the resistors R12 and R14 is connected to the source of the transistor Q14. The gate of the transistor Q14 is connected to the collector of the transistor Q12. The drain of the transistor Q14 is connected to the voltage supply point, and the substrate of the transistor Q14 is grounded.

The first characteristic of the low-noise differential bias circuit 112 is that the bias section for supplying a bias current to the base of the transistor Q1 and the bias section for supplying a bias current to the base of the transistor Q2 are individually configured. The second characteristic is that a voltage is supplied to the resistors R15 and R16 through only one connection point B, and wiring from the voltage supply point to the resistor R15 and wiring from the voltage supply point to the resistor R16 are provided using a common wire. The third characteristic is that the transistor Q13 is inserted between the collector of the transistor Q11 and the connection point between the resistors R11 and R13, and the transistor Q14 is inserted between the collector of the transistor Q12 and the connection point between the resistors R12 and R14.

In the differential signal processing apparatus 2 having the above-described configuration according to the second embodiment, the connection point B can be considered as an imaginary ground point at which the differential signals inputted to the bases of the transistors Q1 and Q2 are canceled. Therefore, the resistance value between the imaginary ground point (connection point B) and the base of the transistor Q1 is increased by the resistor R15, and the resistance value between the imaginary ground point and the base of the transistor Q2 is increased by the resistor R16. Further, since the transistors Q13 and Q14 are inserted, the impedance is increased by the transistors Q13 and Q14. Thus, according to the differential signal processing apparatus 2 of the second embodiment, the noise characteristics can be further improved compared to the foregoing first embodiment. In addition, since the collectors of the transistors Q11 and Q12 are grounded at high frequencies by the bypass capacitors C11 and C12, it is possible to prevent noise generated in the transistors Q11 and Q12 from being inputted to the bases of the transistors Q1 and Q2.

THIRD EMBODIMENT

Figure 3:
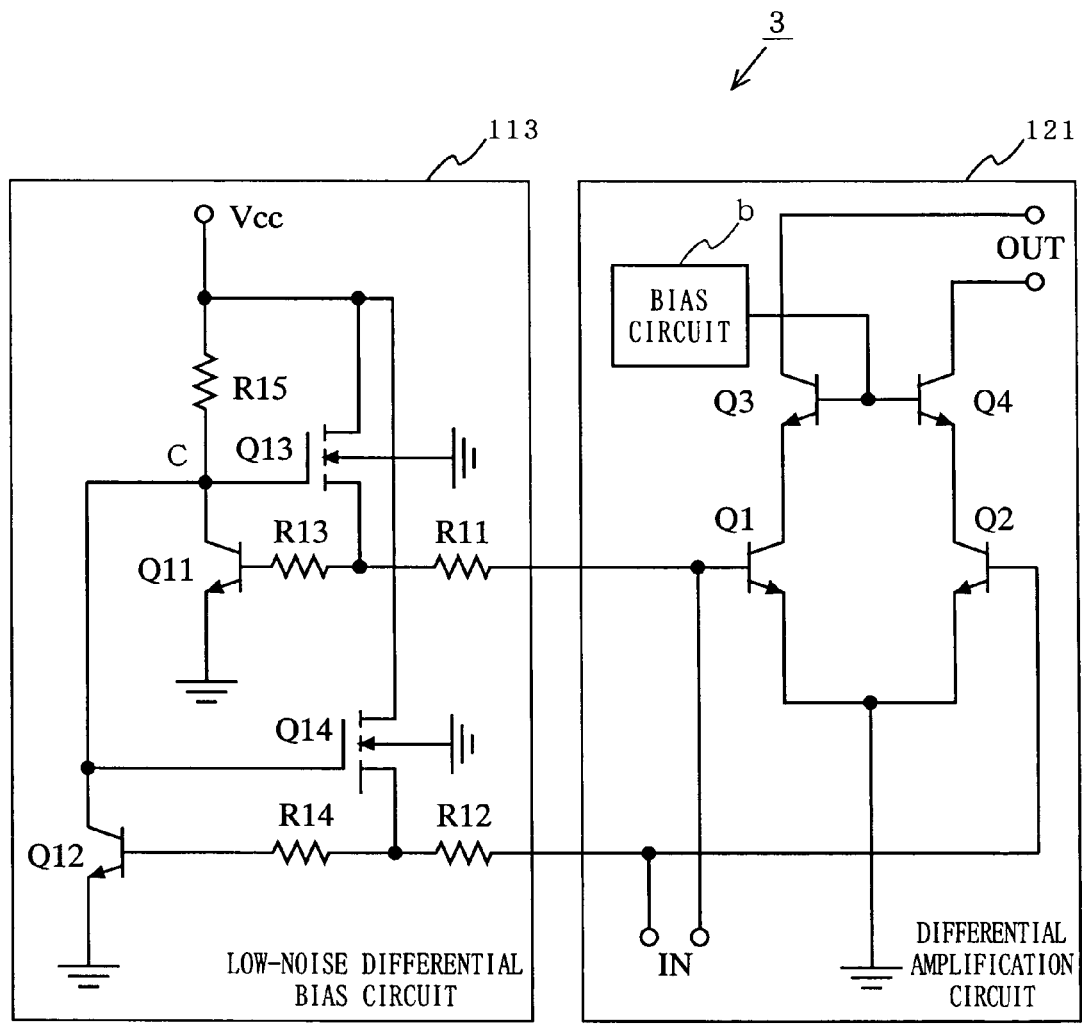
FIG. 3 is a circuit configuration diagram of a differential signal processing apparatus according to a third embodiment of the present invention.

FIG. 3 is a circuit configuration diagram of a differential signal processing apparatus 3 according to a third embodiment of the present invention. In FIG. 3, the differential signal processing apparatus 3 is composed of a low-noise differential bias circuit 113 and a differential amplification circuit 121. The low-noise differential bias circuit 113 includes resistors R11 to R15, NPN bipolar transistors Q11 and Q12, and N-channel MOS field-effect transistors Q13 and Q14. The differential amplification circuit 121 is the same as that described in the foregoing first embodiment.

The configuration and operation of the low-noise differential bias circuit 113 will be described. The collector (connection point C) of the transistor Q11 is connected to a voltage supply point (Vcc) via the resistor R15. The emitter of the transistor Q11 is grounded. The base of the transistor Q11 is connected to the base of the transistor Q1 of the differential amplification circuit 121 via the resistors R13 and R11 connected in series. The connection point between the resistors R11 and R13 is connected to the source of the transistor Q13. The gate of the transistor Q13 is connected to the collector (connection point C) of the transistor Q11. The drain of the transistor Q13 is connected to the voltage supply point, and the substrate of the transistor Q13 is grounded. On the other hand, the collector of the transistor Q12 is connected to the collector (connection point C) of the transistor Q11. The emitter of the transistor Q12 is grounded. The base of the transistor Q12 is connected to the base of the transistor Q2 of the differential amplification circuit 121 via the resistors R14 and R12 connected in series. The connection point between the resistors R12 and R14 is connected to the source of the transistor Q14. The gate of the transistor Q14 is connected to the collector (connection point C) of the transistor Q12. The drain of the transistor Q14 is connected to the voltage supply point, and the substrate of the transistor Q14 is grounded.

The first characteristic of the low-noise differential bias circuit 113 is that the bias section for supplying a bias current to the base of the transistor Q1 and the bias section for supplying a bias current to the base of the transistor Q2 are individually configured. The second characteristic is that the transistor Q13 is inserted between the collector of the transistor Q11 and the connection point between the resistors R11 and R13, and the transistor Q14 is inserted between the collector of the transistor Q12 and the connection point between the resistors R12 and R14. The third characteristic is that the collector of the transistor Q11 is connected to the collector of the transistor Q12 so as to eliminate bypass capacitors C11 and C12.

In the differential signal processing apparatus 3 having the above-described configuration according to the third embodiment, the connection point C can be considered as an imaginary ground point at which the differential signals inputted to the bases of the transistors Q1 and Q2 are canceled. Therefore, the resistance value between the imaginary ground point (connection point C) and the base of the transistor Q1 is increased by the impedance of the inserted transistor Q13, and the resistance value between the imaginary ground point and the base of the transistor Q2 is increased by the impedance of the inserted transistor Q14. Thus, according to the differential signal processing apparatus 3 of the third embodiment, as with the first embodiment, the noise characteristics can be further improved. In addition, since bypass capacitors for grounding the collectors of the transistors Q11 and Q12 can be omitted, it is possible to reduce the number of components and the chip occupation area when the circuit is fabricated into an IC.

Note that the differential signal processing apparatus 3 according to the third embodiment may be used as a doubler by connecting to the input a matching circuit for providing a match at the fundamental wave frequency, and connecting to the output a matching circuit for providing a match at a double wave frequency.

(Circuit Configuration Variants Related to the First to Third Embodiments)

Figure 4:
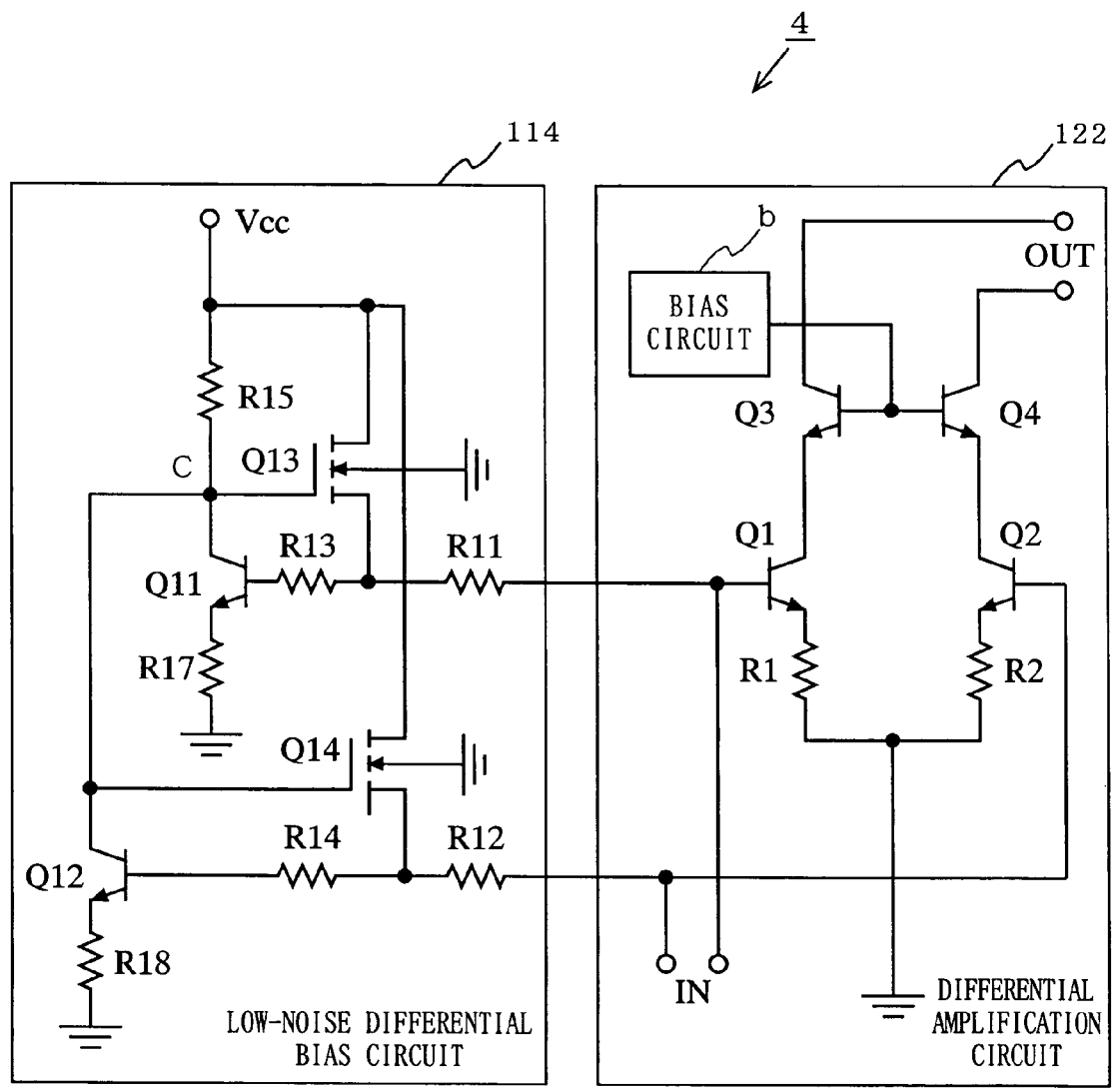
FIG. 4 is a circuit configuration diagram of a differential signal processing apparatus related to the third embodiment.
Figure 5:
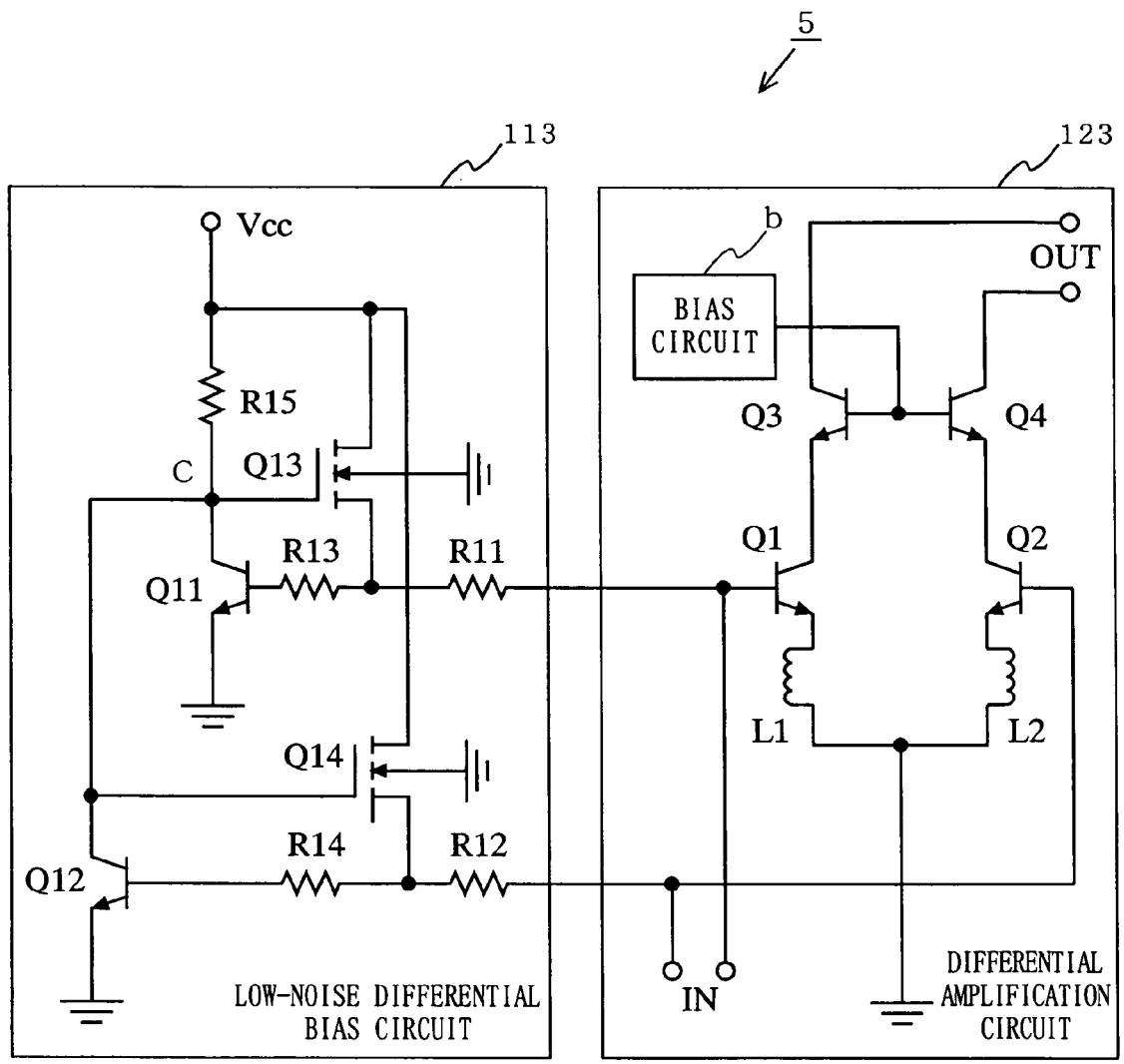
FIG. 5 is a circuit configuration diagram of a differential signal processing apparatus related to the third embodiment.
Figure 6:
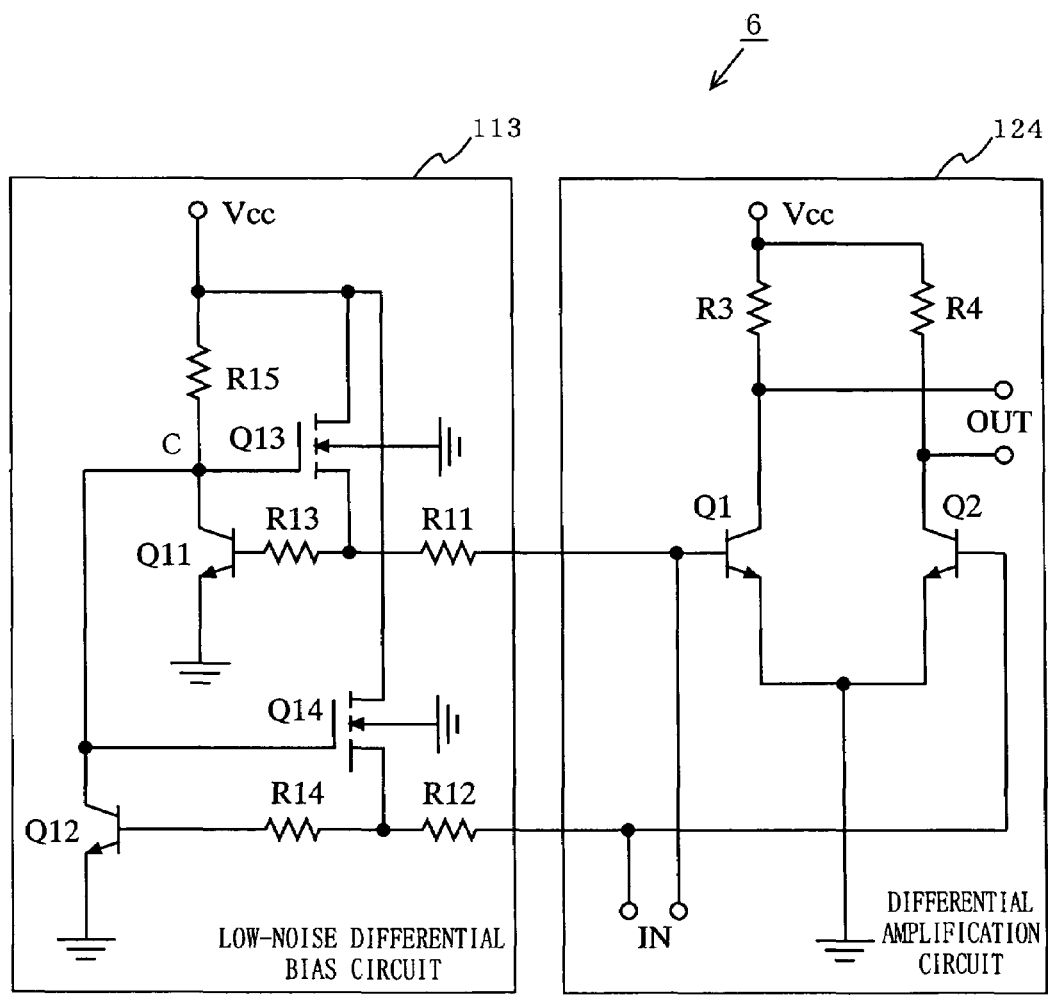
FIG. 6 is a circuit configuration diagram of a differential signal processing apparatus related to the third embodiment.

The foregoing first to third embodiments describe the case where the low-noise differential bias circuits 111 to 113 are used in combination with the differential amplification circuit 121. The differential amplification circuit 121 is, however, merely one example of the differential amplification circuit, and thus the low-noise differential bias circuits 111 to 113 can also be applied to differential amplification circuits 122 to 124 shown in FIGS. 4 to 6, for example. In this case too, the same advantages can be obtained. FIGS. 4 to 6 are diagrams illustrating exemplary configurations to which the circuits based on the low-noise differential bias circuit 113 are applied.

FIG. 4 is a diagram illustrating an exemplary circuit of a differential signal processing apparatus 4 using a differential amplification circuit 122 in which the emitters of transistors Q1 and Q2 are grounded through resistors R1 and R2 so as to reduce current variations caused by variations in transistors. To make the variation characteristics the same for a low-noise differential bias circuit 114 and the differential amplification circuit 122, it is preferred that the emitters of transistors Q11 and Q12 of the low-noise differential bias circuit 114 also be grounded through resistors R17 and R18, as shown in FIG. 4.

FIG. 5 is a diagram illustrating an exemplary circuit of a differential signal processing apparatus 5 using a differential amplification circuit 123 in which the emitters of transistors Q1 and Q2 are grounded through inductors L1 and L2, respectively, so as to further improve the distortion characteristics of the differential signal processing apparatus.

FIG. 6 is a diagram illustrating an exemplary circuit of a differential signal processing apparatus 6 using a differential amplification circuit 124 in which the collectors of transistors Q1 and Q2 are connected to a voltage supply point (Vcc) via resistors R3 and R4, respectively, and signals are outputted from the collectors of transistors Q1 and Q2. In the circuit of the differential signal processing apparatus 6, since the load is a resistor, a broadband amplifier can be realized.

FOURTH EMBODIMENT

The foregoing embodiments describe the differential signal processing apparatuses in which the differential signal processing circuit is a differential amplifier. The following embodiments describe differential signal processing apparatuses in which the differential signal processing circuit is other than the differential amplifier.

Figure 7:
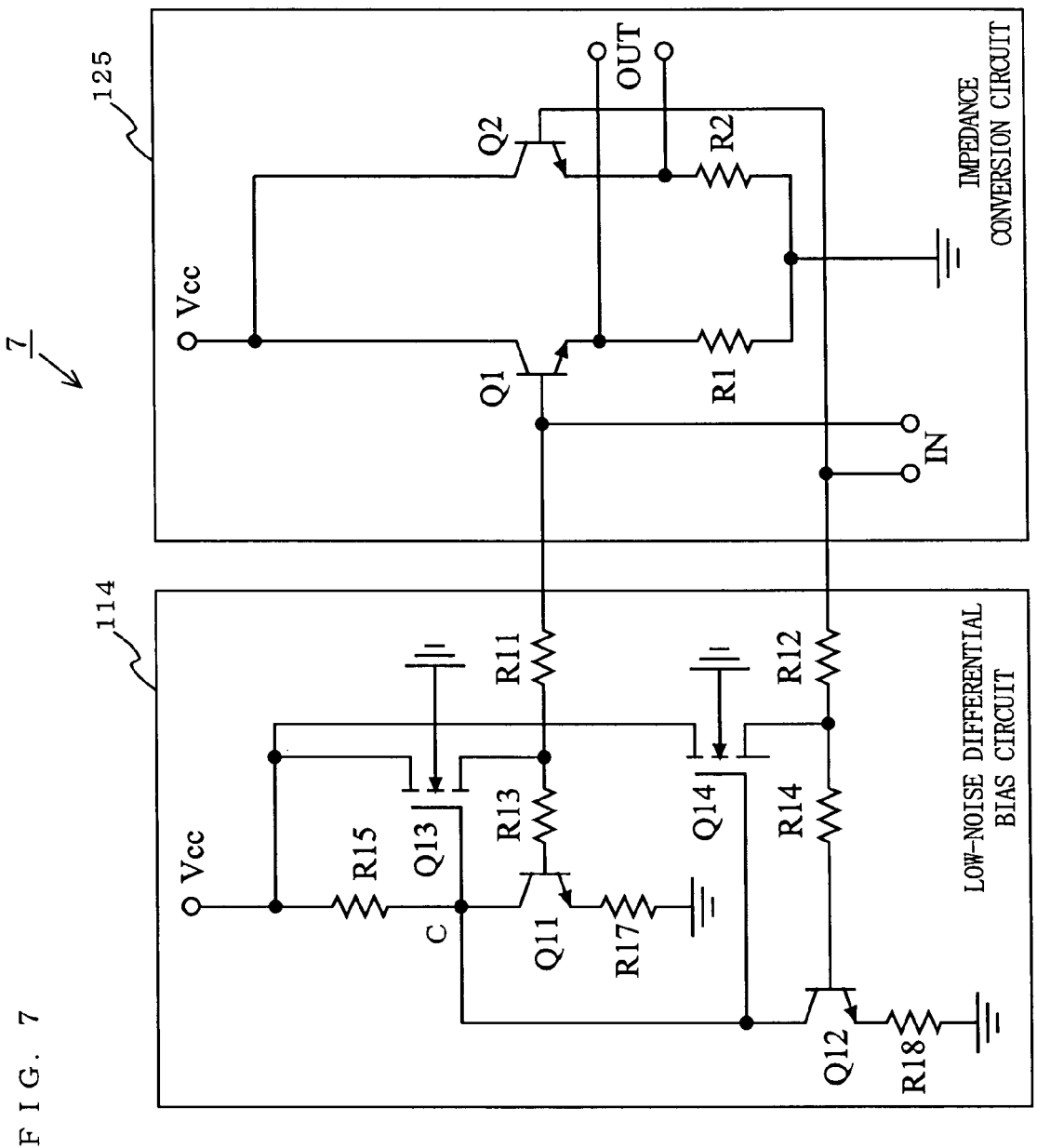
FIG. 7 is a circuit configuration diagram of a differential signal processing apparatus according to a fourth embodiment of the present invention.

FIG. 7 is a circuit configuration diagram of a differential signal processing apparatus 7 according to a fourth embodiment of the present invention. In FIG. 7, the differential signal processing apparatus 7 is composed of a low-noise differential bias circuit 114 and an impedance conversion circuit 125. The low-noise differential bias circuit 114 is the same as those described in the circuit configuration variants of the third embodiment. The impedance conversion circuit 125 includes NPN bipolar transistors Q1 and Q2 and resistors R1 and R2.

The configuration and operation of the impedance conversion circuit 125 will be described. Differential signals (IN) are inputted to the bases of the transistors Q1 and Q2, and also a predetermined bias current is supplied to the bases of the transistors Q1 and Q2 from the low-noise differential bias circuit 114. The collectors of the transistors Q1 and Q2 are connected to a voltage supply point (Vcc). The emitter of the transistor Q1 is grounded through the resistor R1. The emitter of the transistor Q2 is grounded through the resistor R2. That is, by this configuration, an emitter follower circuit is formed. The differential signals inputted to the bases of the transistors Q1 and Q2 are outputted from the emitters (OUT) of the transistors Q1 and Q2, respectively.

By the differential signal processing apparatus 7 having the above-described configuration according to the fourth embodiment, the same advantages can be obtained as those obtained by the differential signal processing apparatus 3 according to the third embodiment and by the differential signal processing apparatus 4 of a circuit configuration variant.

FIFTH EMBODIMENT

Figure 8:
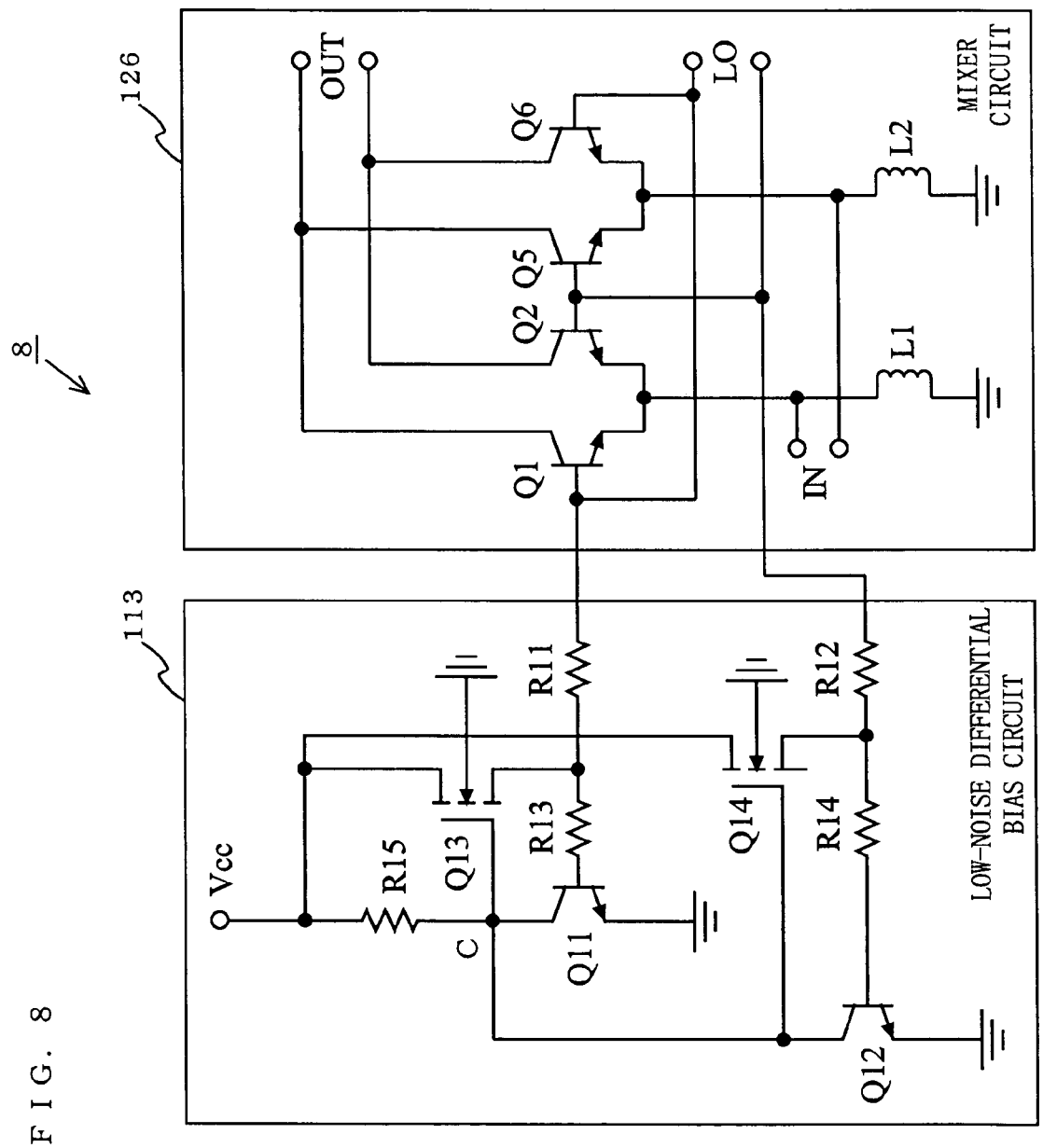
FIG. 8 is a circuit configuration diagram of a differential signal processing apparatus according to a fifth embodiment of the present invention.

FIG. 8 is a circuit configuration diagram of a differential signal processing apparatus 8 according to a fifth embodiment of the present invention. In FIG. 8, the differential signal processing apparatus 8 is composed of a low-noise differential bias circuit 113 and a mixer circuit 126. The low-noise differential bias circuit 113 is the same as that described in the third embodiment. The mixer circuit 126 includes NPN bipolar transistors Q1, Q2, Q5, and Q6 and inductors L1 and L2.

The configuration and operation of the mixer circuit 126 will be described. The bases of the transistors Q1 and Q6 are commonly connected to each other, and the bases of the transistors Q2 and Q5 are commonly connected to each other. Local differential signals (LO) are inputted to the bases of the transistors Q1, Q2, Q5, and Q6, and a predetermined bias current is supplied to the bases of the transistors Q1, Q2, Q5, and Q6 from the low-noise differential bias circuit 113. The emitters of the transistors Q1 and Q2 are commonly connected to each other and grounded through the inductor L1. The emitters of the transistors Q5 and Q6 are commonly connected to each other and grounded through the inductor L2. Input differential signals (IN) are inputted to the common connection point between the emitters of the transistors Q1 and Q2, and to the common connection point between the emitters of the transistors Q5 and Q6. The collectors of the transistors Q1 and Q5 are commonly connected to each other, and the collectors of the transistors Q2 and Q6 are commonly connected to each other. By this configuration, a double-balanced mixer circuit is formed. The input differential signals and the local differential signals are mixed by the transistors Q1, Q2, Q5, and Q6, and the mixed signals are subjected to addition or subtraction and then outputted from the common collector (OUT) of the transistors Q1 and Q5 and from the common collector (OUT) of the transistors Q2 and Q6.

By the differential signal processing apparatus 8 having the above-described configuration according to the fifth embodiment, the same advantage can be obtained as that obtained by the differential signal processing apparatus 3 according to the third embodiment. Needless to say, a single-balanced mixer circuit can be formed with a pair of the transistors Q1 and Q2 or a pair of the transistors Q5 and Q6 of the mixer circuit 126. In this case, local differential signals and one of input differential signals are mixed and outputted from the collector.

SIXTH EMBODIMENT

Figure 9:
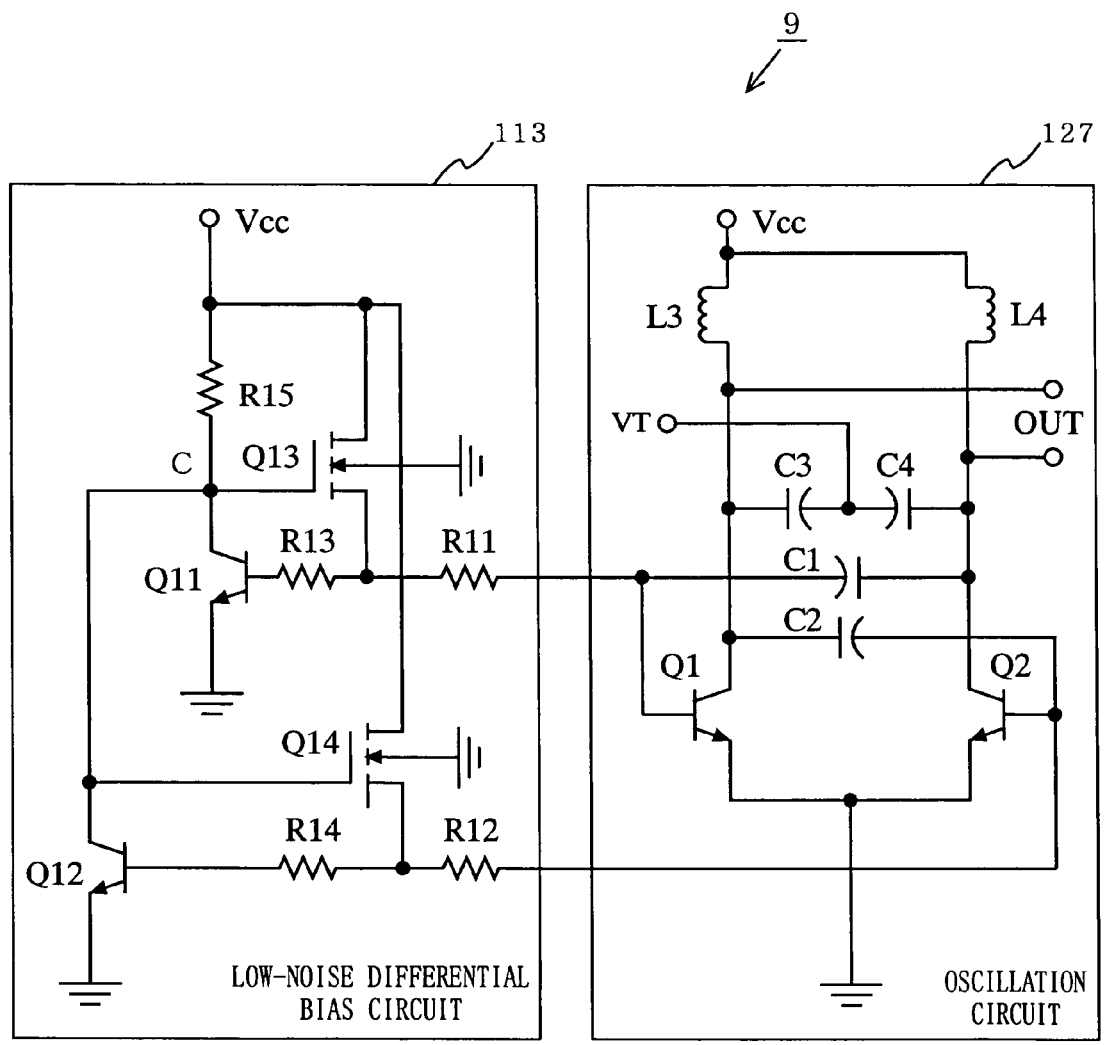
FIG. 9 is a circuit configuration diagram of a differential signal processing apparatus according to a sixth embodiment of the present invention.

FIG. 9 is a circuit configuration diagram of a differential signal processing apparatus 9 according to a sixth embodiment of the present invention. In FIG. 9, the differential signal processing apparatus 9 is composed of a low-noise differential bias circuit 113 and an oscillation circuit 127. The low-noise differential bias circuit 113 is the same as that described in the third embodiment. The oscillation circuit 127 includes NPN bipolar transistors Q1 and Q2, inductors L3 and L4, and capacitors C1 to C4.

The configuration and operation of the oscillation circuit 127 will be described. A predetermined bias current is supplied to the bases of the transistors Q1 and Q2 from the low-noise differential bias circuit 113. The collectors of the transistors Q1 and Q2 are connected to a voltage supply point (Vcc) via the inductors L3 and L4, respectively. The emitters of the transistors Q1 and Q2 are commonly connected to each other and grounded. A DC cut capacitor C1 is inserted between the base of the transistor Q1 and the collector of the transistor Q2. A DC cut capacitor C2 is inserted between the base of the transistor Q2 and the collector of the transistor Q1. A bias current is supplied from a voltage supply point (VT) to the collector of the transistor Q1 through a DC cut capacitor C3, and to the collector of the transistor Q2 through a DC cut capacitor C4. That is, by this configuration, an LC-type voltage-controlled oscillator is formed. The outputs from the collectors of the transistors Q1 and Q2 are inputted to the bases of the transistors Q2 and Q1 by positive feedback, and thus oscillation occurs. The oscillation frequency is determined by the resonance frequencies of the inductors L3 and L4 and capacitors C3 and C4, which are connected in parallel between the collectors of the transistors Q1 and Q2.

By the differential signal processing apparatus 9 having the above-described configuration according to the sixth embodiment, the same advantage can be obtained as that obtained by the differential signal processing apparatus 3 according to the third embodiment.

SEVENTH EMBODIMENT

In the foregoing first to sixth embodiments, the low-noise differential bias circuits of the present invention are described with a circuit configuration using NPN bipolar transistors and N-channel MOS field-effect transistors. The present invention may also employ a circuit configuration using PNP bipolar transistors and P-channel MOS field-effect transistors, depending on the configuration of the differential signal processing circuit side. A seventh embodiment describes, as a representative example, a circuit using PNP bipolar transistors instead of using the circuit configuration of the first embodiment.

Figure 10:
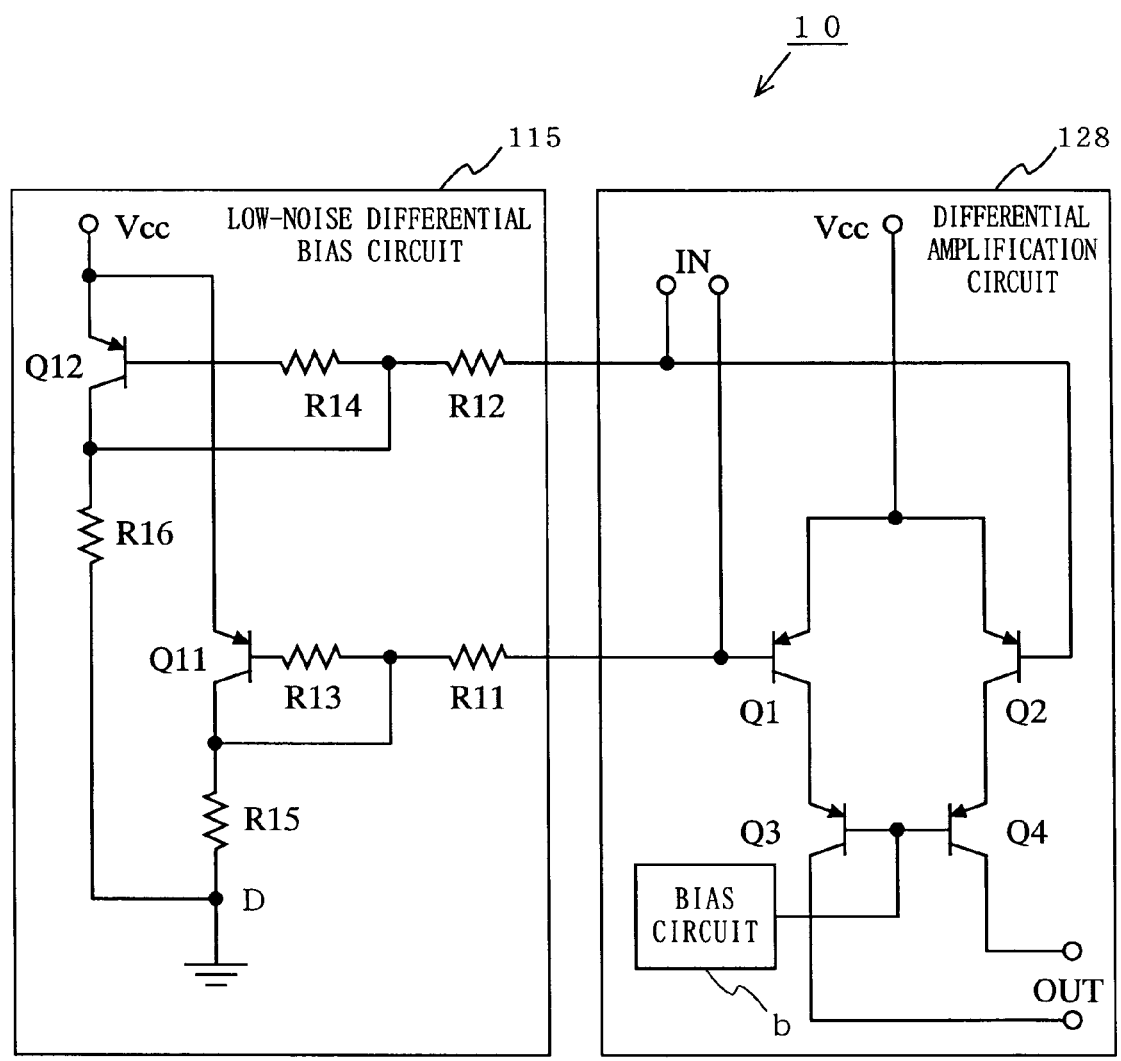
FIG. 10 is a circuit configuration diagram of a differential signal processing apparatus according to a seventh embodiment of the present invention.

FIG. 10 is a circuit configuration diagram of a differential signal processing apparatus 10 according to the seventh embodiment of the present invention. In FIG. 10, the differential signal processing apparatus 10 is composed of a low-noise differential bias circuit 115 and a differential amplification circuit 128. The low-noise differential bias circuit 115 includes resistors R11 to R16 and PNP bipolar transistors Q11 and Q12. The differential amplification circuit 128 includes PNP bipolar transistors Q1 to Q4 and a bias circuit b.

The configuration and operation of the low-noise differential bias circuit 115 will be described. The emitter of the transistor Q11 is connected to a voltage supply point (Vcc). The base of the transistor Q11 is connected to the base of the transistor Q1 of the differential amplification circuit 128 via the resistors R13 and R11 connected in series. The connection point between the resistors R11 and R13 is connected to the collector of the transistor Q11. The collector of the transistor Q11 is grounded through the resistor R15. On the other hand, the emitter of the transistor Q12 is connected to the voltage supply point. The base of the transistor Q12 is connected to the base of the transistor Q2 of the differential amplification circuit 128 via the resistors R14 and R12 connected in series. The connection point between the resistors R12 and R14 is connected to the collector of the transistor Q12. The collector of the transistor Q12 is grounded at a connection point D through the resistor R16.

Next, the configuration and operation of the differential amplification circuit 128 will be described. Differential signals (IN) are inputted to the bases of the transistors Q1 and Q2, and also a predetermined bias current is supplied to the bases of the transistors Q1 and Q2 from the low-noise differential bias circuit 115. The emitters of the transistors Q1 and Q2 are commonly connected to each other and connected to a voltage supply point. The emitters of the transistors Q3 and Q4 are connected to the collectors of the transistors Q1 and Q2, respectively, and the signals outputted from the collectors of the transistors Q1 and Q2 are inputted to the emitters of the transistors Q3 and Q4. The bases of the transistors Q3 and Q4 are commonly connected to each other, and a predetermined bias current is supplied to the bases of the transistors Q3 and Q4 from the bias circuit b. The amplified signals (OUT) are outputted from the collectors of the transistors Q3 and Q4.

In the differential signal processing apparatus 10 having the above-described configuration according to the seventh embodiment, the connection point D can be considered as an imaginary ground point at which the differential signals inputted to the bases of the transistors Q1 and Q2 are canceled. Thus, according to the differential signal processing apparatus 10 of the seventh embodiment, as with the first embodiment, the noise characteristics can be further improved.

Note that MOS field-effect transistors may be used instead of the bipolar transistors Q1 to Q4, Q11, and Q12 included in the differential signal processing apparatuses 1 to 10 according to the first to seventh embodiments. Alternatively, bipolar transistors may be used instead of the MOS field-effect transistors Q13 and Q14.

EIGHTH EMBODIMENT

Figure 11:
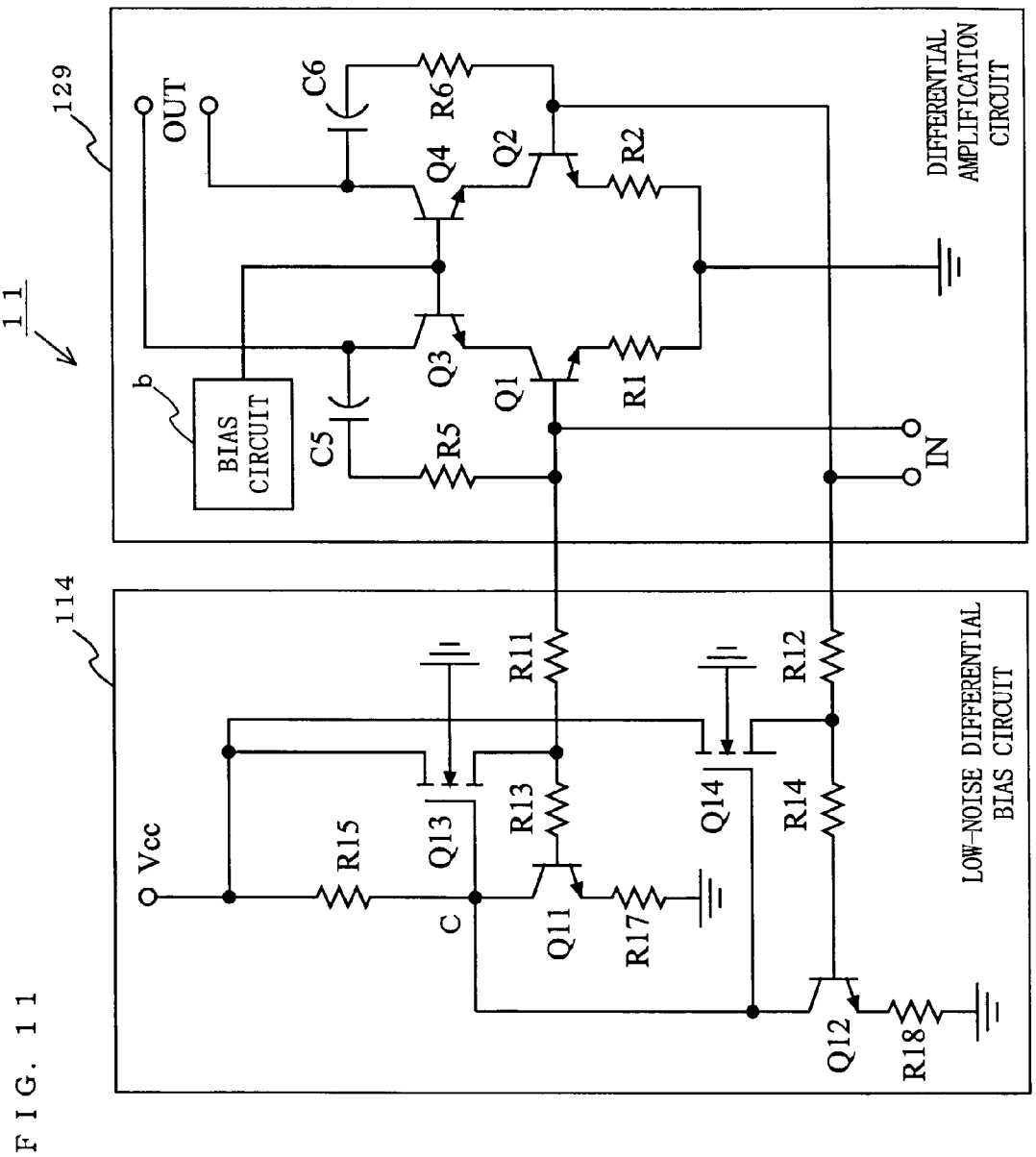
FIG. 11 is a circuit configuration diagram of a differential signal processing apparatus according to an eighth embodiment of the present invention.

FIG. 11 is a circuit configuration diagram of a differential signal processing apparatus 11 according to an eighth embodiment of the present invention. In FIG. 11, the differential signal processing apparatus 11 is composed of a low-noise differential bias circuit 114 and a differential amplification circuit 129. The low-noise differential bias circuit 114 is the same as those described in the third embodiment and in the circuit configuration variants related to the third embodiment. The differential amplification circuit 129 includes NPN bipolar transistors Q1 to Q4, resistors R1, R2, R5, and R6, capacitors C5 and C6, and a bias circuit b.

The configuration and operation of the differential amplification circuit 129 will be described. Differential signals (IN) are differentially inputted to the bases of the transistors Q1 and Q2, and also a predetermined bias current is supplied to the bases of the transistors Q1 and Q2 from the low-noise differential bias circuit 114. The emitters of the transistors Q1 and Q2 are grounded through the resistors R1 and R2, respectively. The emitters of the transistors Q3 and Q4 are connected to the collectors of the transistors Q1 and Q2, respectively, and the signals outputted from the collectors of the transistors Q1 and Q2 are inputted to the emitters of the transistors Q3 and Q4. The bases of the transistors Q3 and Q4 are commonly connected to each other, and a predetermined bias current is supplied to the bases of the transistors Q3 and Q4 from the bias circuit b. Then, the amplified signals (OUT) are outputted from the collectors of the transistors Q3 and Q4.

The collector of the transistor Q3 is connected to the base of the transistor Q1 via the capacitor C5 and the resistor R5 connected in series. Similarly, the collector of the transistor Q4 is connected to the base of the transistor Q2 via the capacitor C6 and the resistor R6 connected in series. By these connections, the pathways are created through which the amplified signals outputted from the collectors of the transistors Q3 and Q4 are feedback-inputted to the bases of the transistors Q1 and Q2, respectively.

In the differential signal processing apparatus 11 having the above-described configuration according to the eighth embodiment, the output signals are negatively fed back using a feedback circuit and a differential amplification circuit which performs inverting amplification. By this, the linear characteristics of the differential amplification circuit can be further improved. Accordingly, a differential signal processing apparatus can be realized which provides a wider dynamic range (i.e., low noise and low distortion) than the differential signal processing apparatus 3 according to the third embodiment.

NINTH EMBODIMENT

Figure 12:
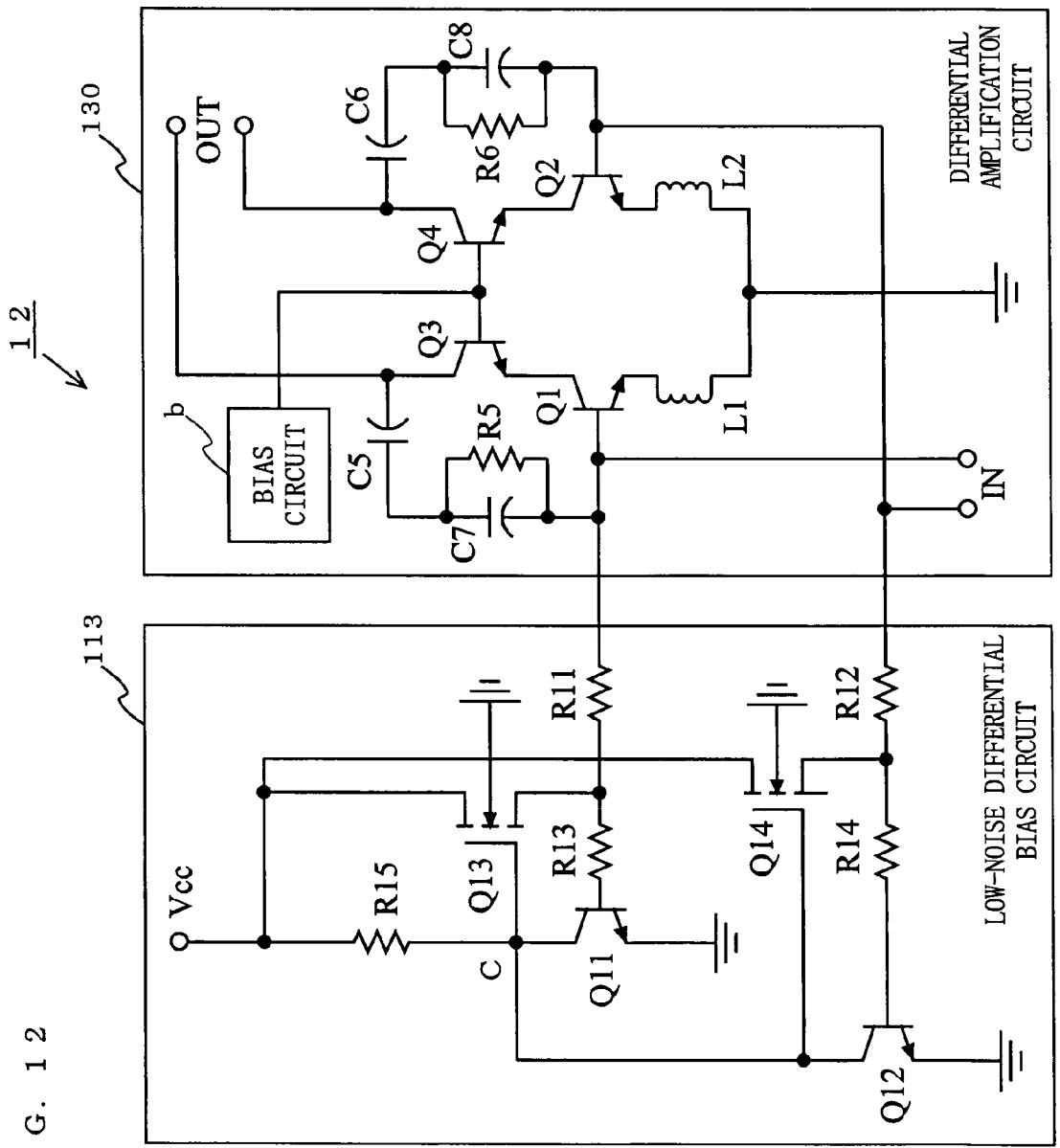
FIG. 12 is a circuit configuration diagram of a differential signal processing apparatus according to a ninth embodiment of the present invention.

FIG. 12 is a circuit configuration diagram of a differential signal processing apparatus 12 according to a ninth embodiment of the present invention. In FIG. 12, the differential signal processing apparatus 12 is composed of a low-noise differential bias circuit 113 and a differential amplification circuit 130. The low-noise differential bias circuit 113 is the same as that described in the third embodiment. The differential amplification circuit 130 includes NPN bipolar transistors Q1 to Q4, inductors L1 and L2, resistors R5 and R6, capacitors C5 and C8, and a bias circuit b.

The configuration and operation of the differential amplification circuit 130 will be described. Differential signals (IN) are differentially inputted to the bases of the transistors Q1 and Q2, and also a predetermined bias current is supplied to the bases of the transistors Q1 and Q2 from the low-noise differential bias circuit 113. The emitters of the transistors Q1 and Q2 are grounded through the inductors L1 and L2, respectively. The emitters of the transistors Q3 and Q4 are connected to the collectors of the transistors Q1 and Q2, respectively, and the signals outputted from the collectors of the transistors Q1 and Q2 are inputted to the emitters of the transistors Q3 and Q4. The bases of the transistors Q3 and Q4 are commonly connected to each other, and a predetermined bias current is supplied to the bases of the transistors Q3 and Q4 from the bias circuit b. Then, the amplified signals (OUT) are outputted from the collectors of the transistors Q3 and Q4.

The collector of the transistor Q3 is connected to one end of the capacitor C5. The other end of the capacitor C5 is connected to the base of the transistor Q1 via the capacitor C7 and the resistor R5 connected in parallel. Similarly, the collector of the transistor Q4 is connected to one end of the capacitor C6. The other end of the capacitor C6 is connected to the base of the transistor Q2 via the capacitor C8 and the resistor R6 connected in parallel. By these connections, the pathways are created through which the amplified signals outputted from the collectors of the transistors Q3 and Q4 are feedback-inputted to the bases of the transistors Q1 and Q2, respectively.

In the differential signal processing apparatus 12 having the above-described configuration according to the ninth embodiment, the output signals are negatively fed back using a feedback circuit and a differential amplification circuit which performs inverting amplification. In addition, the maintenance of a 180-degree phase difference between the input and output signals which occurs because of the use of the inductors in the differential amplification circuit, can be improved by inverting the phase of an output signal and negatively feeding back the phase inverted output signal to the input. By the interaction of the inductors and the negative feedback, the linear characteristics of the differential amplification circuit can be further improved compared to the differential signal processing apparatus 11 according to the eighth embodiment.

TENTH EMBODIMENT

The foregoing embodiments describe differential signal processing apparatuses having various functions. The following embodiments describe radio circuit apparatuses using such differential signal processing apparatuses.

Figure 13:
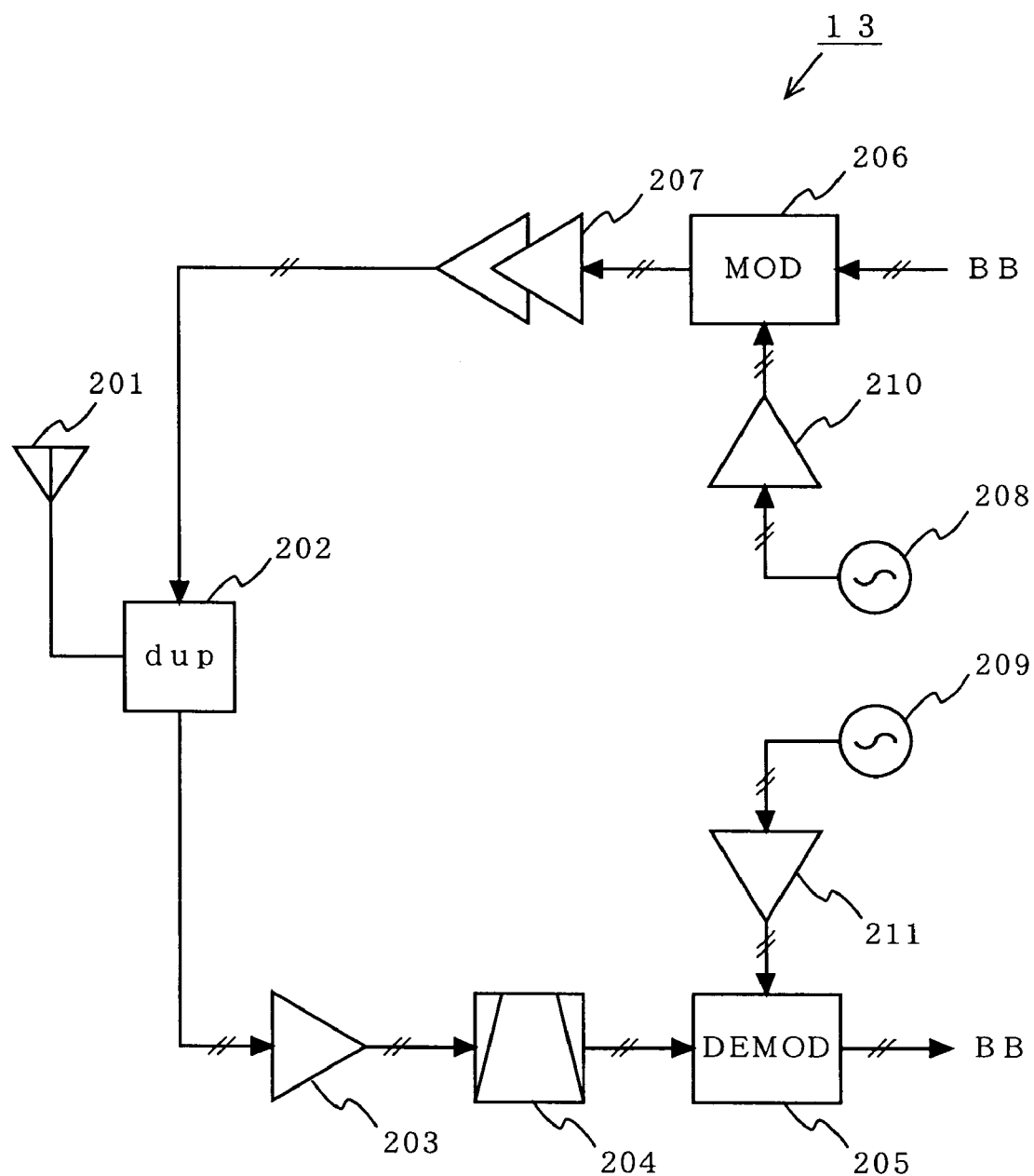
FIG. 13 is a circuit configuration diagram of a radio circuit apparatus according to a tenth embodiment of the present invention.

FIG. 13 is a circuit configuration diagram of a radio circuit apparatus 13 according to a tenth embodiment of the present invention. In FIG. 13, the radio circuit apparatus 13 includes an antenna 201, a duplexer 202, a low-noise amplifier 203, a filter 204, a demodulator 205, a modulator 206, a power amplifier 207, oscillators 208 and 209, and local signal amplifiers 210 and 211. The low-noise amplifier 203, the filter 204, the demodulator 205, the oscillator 209, and the local signal amplifier 211 compose a receiving circuit. The modulator 206, the power amplifier 207, the oscillator 208, and the local signal amplifier 210 compose a transmitting circuit. The duplexer 202 allows the use of a single antenna 201 for both the transmitting circuit and the receiving circuit. The demodulator 205 operates as a down-mixer. The modulator 206 operates as an up-mixer.

In the above-described configuration, any of the differential signal processing apparatuses described in the first to third, eighth, and ninth embodiments is applied to the low-noise amplifier 203, the power amplifier 207, and the local signal amplifiers 210 and 211. The differential signal processing apparatus described in the fifth embodiment is applied to the demodulator 205 and the modulator 206.

Further, the differential signal processing apparatus described in the sixth embodiment is applied to the oscillators 208 and 209.

In the receiving circuit, a signal received by the antenna 201 is inputted to the low-noise amplifier 203 through the duplexer 202. The signal amplified by and outputted from the low-noise amplifier 203 is inputted to the demodulator 205 through the filter 204. The demodulator 205 demodulates the signal inputted from the low-noise amplifier 203, using a local signal which is generated in the oscillator 209 and amplified by the local signal amplifier 211. The signal demodulated by the demodulator 205 is outputted to a BB circuit (not shown) as a BB signal.

In the transmitting circuit, a BB signal outputted from the BB circuit is inputted to the modulator 206. The modulator 206 modulates the signal inputted from the BB circuit, using a local signal which is generated in the oscillator 208 and amplified by the local signal amplifier 210. The signal modulated by the modulator 206 is amplified by the power amplifier 207 and then transmitted from the antenna 201 through the duplexer 202.

As described in the tenth embodiment, by applying any of the differential signal processing apparatuses of the first to ninth embodiments to the configuration of the radio circuit apparatus 13, a radio circuit apparatus which provides a wide dynamic range (i.e., low noise and low distortion) can be realized.

ELEVENTH EMBODIMENT

Figure 14:
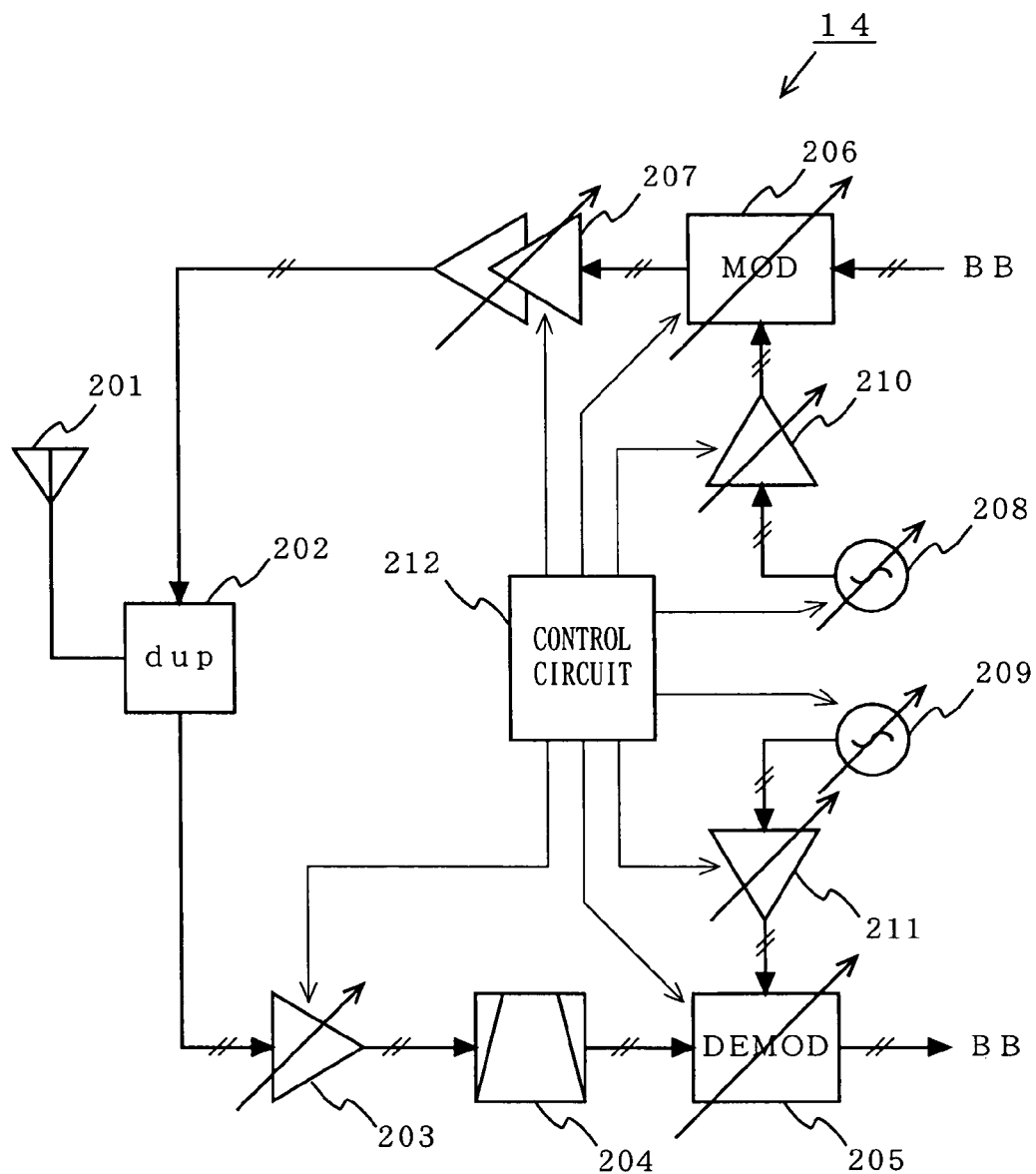
FIG. 14 is a circuit configuration diagram of a radio circuit apparatus according to an eleventh embodiment of the present invention.

FIG. 14 is a circuit configuration diagram of a radio circuit apparatus 14 according to an eleventh embodiment of the present invention. In FIG. 14, the radio circuit apparatus 14 includes an antenna 201, a duplexer 202, a low-noise amplifier 203, a filter 204, a demodulator 205, a modulator 206, a power amplifier 207, oscillators 208 and 209, local signal amplifiers 210 and 211, and a control circuit 212.

As can be seen in FIG. 14, the radio circuit apparatus 14 according to the eleventh embodiment is different from the radio circuit apparatus 13 according to the tenth embodiment in that the low-noise amplifier 203, the demodulator 205, the modulator 206, the power amplifier 207, the oscillators 208 and 209, and the local signal amplifiers 210 and 211 are controlled by the control circuit 212.

Figure 15:
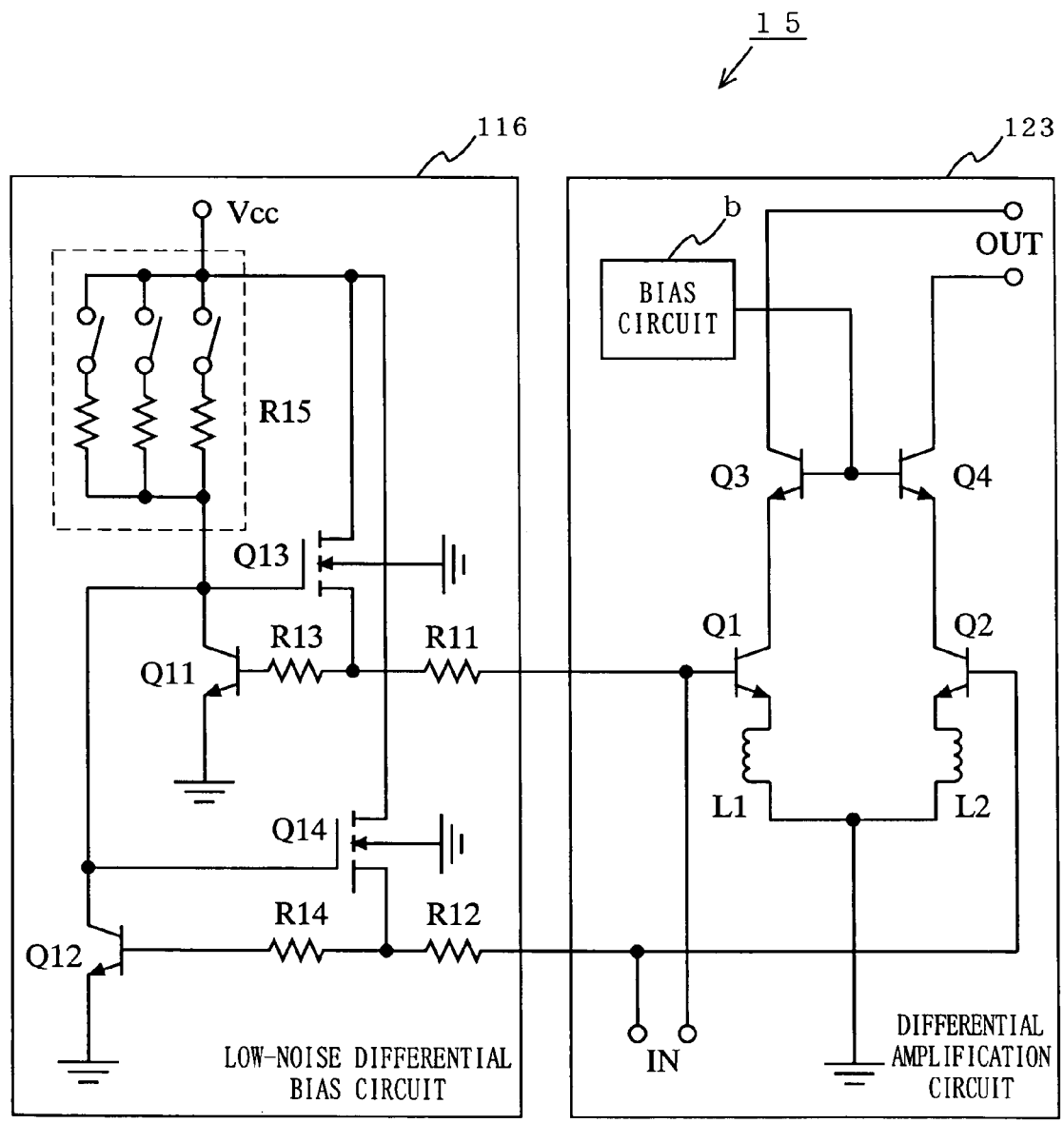
FIG. 15 is a circuit configuration diagram of a differential signal processing apparatus related to the eleventh embodiment.

The control by the control circuit 212 is performed as follows. In a radio circuit apparatus which allows simultaneous transmission and reception, a part of the transmission power for transmission may leak into the receiving circuit side, causing reception interference. Thus, the dynamic range of the receiving circuit is most needed when the transmission power is high. In view of this, in the radio circuit apparatus 14, the control circuit 212 changes the currents of the low-noise amplifier 203, the demodulator 205, the modulator 206, the power amplifier 207, the oscillators 208 and 209, and the local signal amplifiers 210 and 211. Specifically, in the case of increasing the transmission power by increasing the current of the transmitting circuit, the control circuit 212 increases the consumption current of the receiving circuit. On the other hand, in the case of reducing the transmission power by reducing the current of the transmitting circuit, the control circuit 212 reduces the consumption current of the receiving circuit. FIG. 15 is a diagram illustrating an exemplary configuration of a current-switchable low-noise differential bias circuit 116.

As described in the eleventh embodiment, by applying any of the differential signal processing apparatuses according to the first to ninth embodiments to the configuration of the radio circuit apparatus 14, a radio circuit apparatus can be realized which reduces the influence of transmission power leakage and provides a wide dynamic range (i.e., low noise and low distortion).

TWELFTH EMBODIMENT

Figure 16:
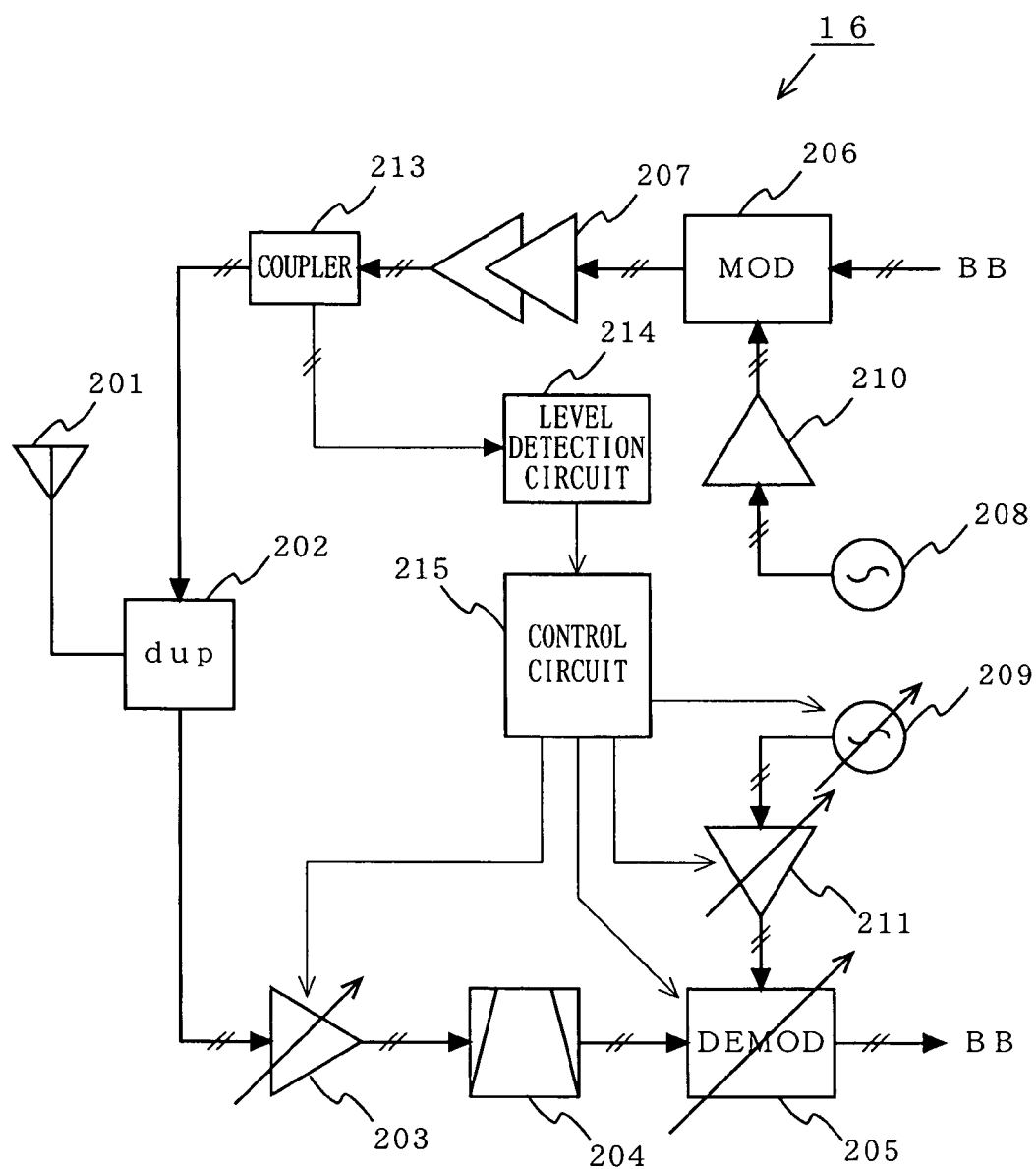
FIG. 16 is a circuit configuration diagram of a radio circuit apparatus according to a twelfth embodiment of the present invention.

FIG. 16 is a circuit configuration diagram of a radio circuit apparatus 16 according to a twelfth embodiment of the present invention. In FIG. 16, the radio circuit apparatus 16 includes an antenna 201, a duplexer 202, a low-noise amplifier 203, a filter 204, a demodulator 205, a modulator 206, a power amplifier 207, a coupler 213, oscillators 208 and 209, local signal amplifiers 210 and 211, a level detection circuit 214, and a control circuit 215.

As can be seen in FIG. 16, the radio circuit apparatus 16 according to the twelfth embodiment is different from the radio circuit apparatus 14 according to the eleventh embodiment. It is different because the control of the receiving circuit side (including the low-noise amplifier 203, the demodulator 205, the oscillator 209, and the local signal amplifier 211) by the control circuit 215 is performed dynamically based on a transmission power value detected by the coupler 213 and the level detection circuit 214.

Figure 17:
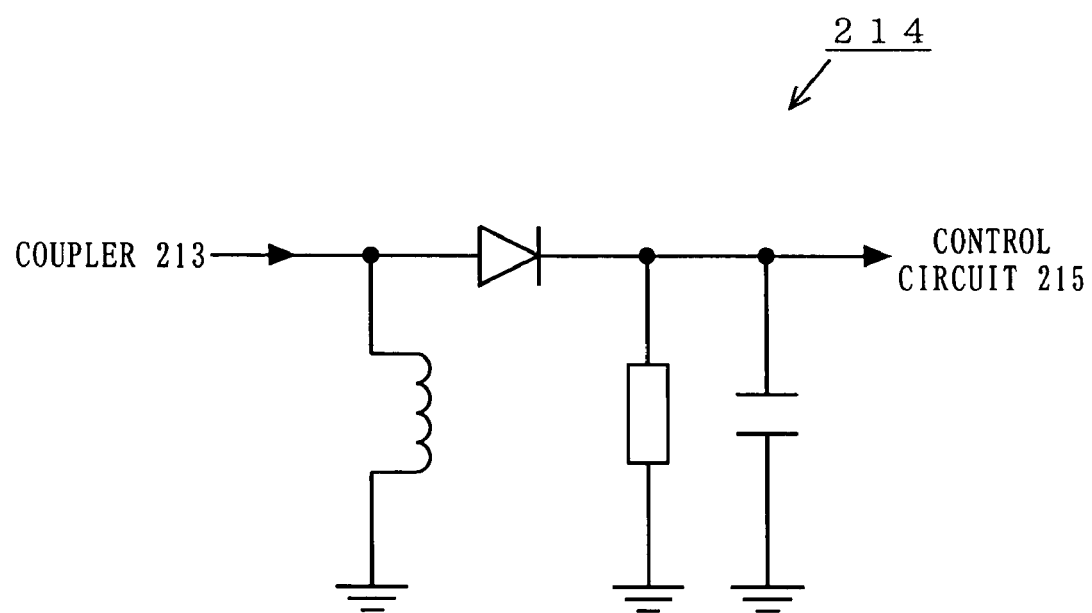
FIG. 17 is a circuit configuration diagram of a level detection circuit included in the radio circuit apparatus 16.

The control by the coupler 213, the level detection circuit 214, and the control circuit 215 is performed as follows. A part of the transmission power outputted from the power amplifier 207 is extracted by the coupler 213, and then inputted to the level detection circuit 214. The level detection circuit 214 detects the level of the extracted transmission power and then notifies the control circuit 215 of the detected power level. The control circuit 215 controls, based on the detected result by the level detection circuit 214, the increase or decrease of the current values of the low-noise amplifier 203, the demodulator 205, the oscillator 209, and the local signal amplifier 211, which compose the receiving circuit. FIG. 17 is a diagram illustrating an exemplary configuration of the level detection circuit 214.

As described in the twelfth embodiment, by applying any of the differential signal processing apparatuses according to the first to ninth embodiments to the configuration of the radio circuit apparatus 16, a radio circuit apparatus can be realized which reduces the influence of a transmission power leakage by actually measuring transmission power, and provides a wide dynamic range (i.e., low noise and low distortion).

Note that the method of extracting a part of the transmission power outputted from the power amplifier 207 is not limited to the above-described method using the coupler 213. For example, the transmission power outputted from the power amplifier 207 may be simply split at a ratio at which transmission is not influenced.

THIRTEENTH EMBODIMENT

Figure 18:
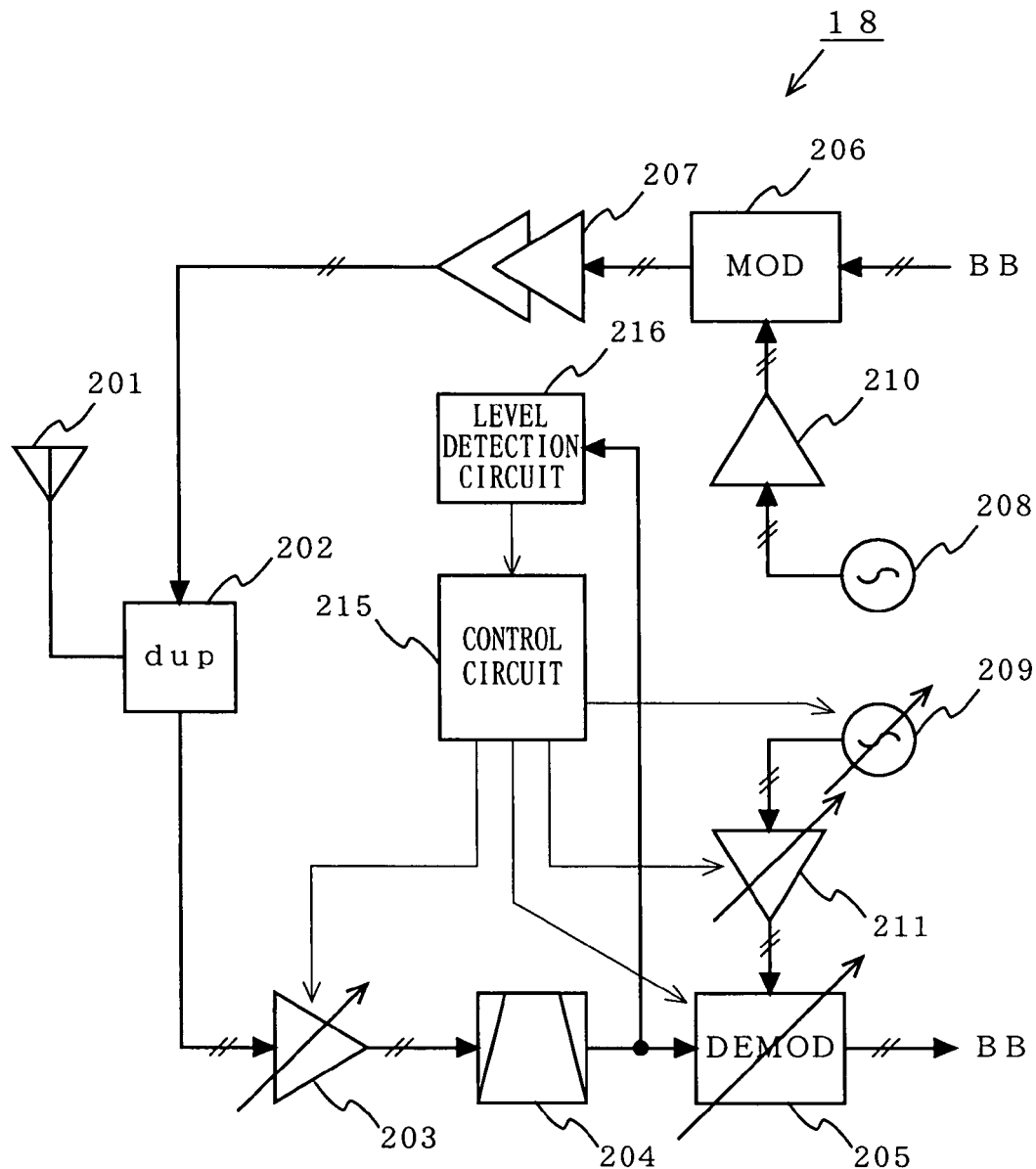
FIG. 18 is a circuit configuration diagram of a radio circuit apparatus according to a thirteenth embodiment of the present invention.

FIG. 18 is a circuit configuration diagram of a radio circuit apparatus 18 according to a thirteenth embodiment of the present invention. In FIG. 18, the radio circuit apparatus 18 includes an antenna 201, a duplexer 202, a low-noise amplifier 203, a filter 204, a demodulator 205, a modulator 206, a power amplifier 207, oscillators 208 and 209, local signal amplifiers 210 and 211, a level detection circuit 216, and a control circuit 215.

As can be seen in FIG. 18, the radio circuit apparatus 18 according to the thirteenth embodiment is different from the radio circuit apparatus 16 according to the twelfth embodiment in that the control of the receiving circuit side by the control circuit 215 is performed dynamically based on a reception power level detected by the level detection circuit 216.

The control by the level detection circuit 216 and the control circuit 215 is performed as follows. In a radio circuit apparatus which allows simultaneous transmission and reception, the dynamic range of the receiving circuit is most needed when the reception power including an interference wave is high. In view of this, in the radio circuit apparatus 18, the level detection circuit 216 is connected subsequent to the low-noise amplifier 203 so as not to degrade noise characteristics. When the reception power is increased, the control circuit 215 increases the consumption current of the receiving circuit, and when the reception power is reduced, the control circuit 215 reduces the consumption current of the receiving circuit.

Figure 19:
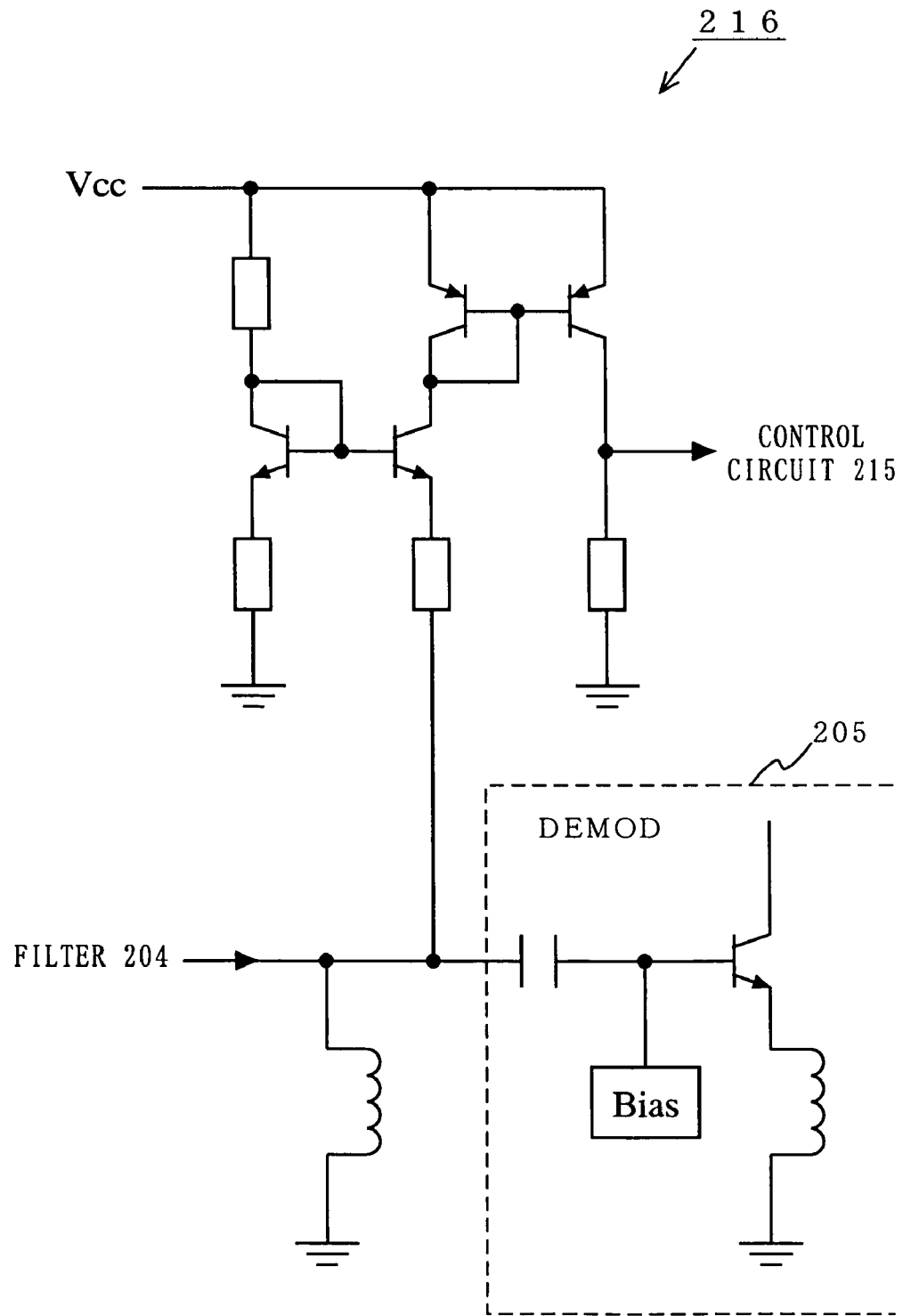
FIG. 19 is a circuit configuration diagram of a level detection circuit included in the radio circuit apparatus 18.

A receive signal in which a desired wave and an interference wave are multiplexed is inputted to the low-noise amplifier 203 and then amplified to a predetermined level. The amplified receive signal is inputted to the demodulator 205 and the level detection circuit 216 through the filter 204. The level detection circuit 216 detects the total power level of the interference wave and the desired wave before being inputted to the demodulator 205, and then notifies the control circuit 215 of the detected total power level. The control circuit 215 controls, based on the detection result by the level detection circuit 216, the increase or decrease of the current values of the low-noise amplifier 203, the demodulator 205, the oscillator 209, and the local signal amplifier 211, which compose the receiving circuit. FIG. 19 is a diagram illustrating an exemplary configuration of the level detection circuit 216.

As described in the thirteenth embodiment, by applying any of the differential signal processing apparatuses according to the first to ninth embodiments to the configuration of the radio circuit apparatus 18, a radio circuit apparatus can be realized which reduces the influence of transmission power leakage by actually measuring reception power, and provides a wide dynamic range (i.e., low noise and low distortion).

FOURTEENTH EMBODIMENT

Figure 20:
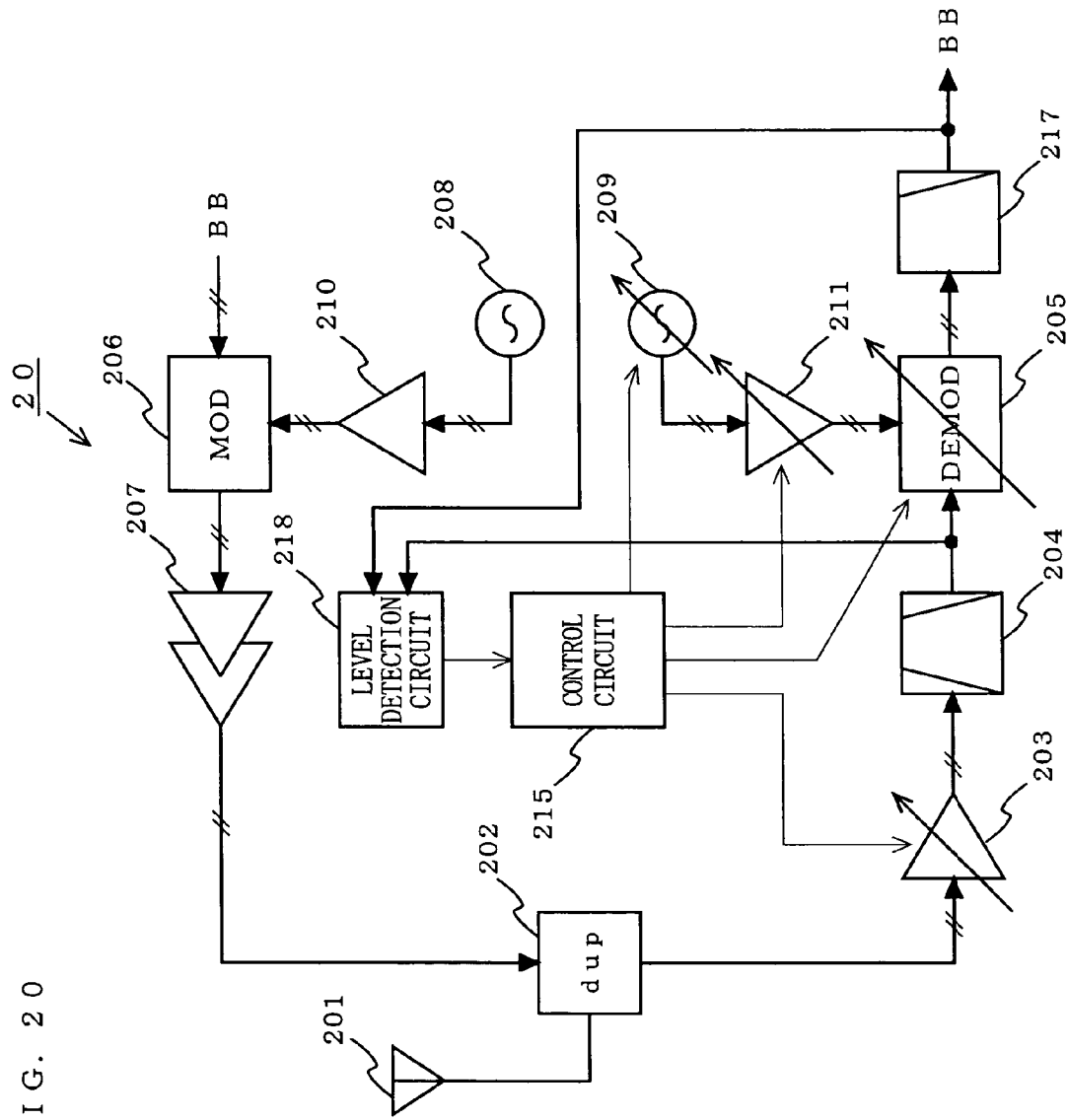
FIG. 20 is a circuit configuration diagram of a radio circuit apparatus according to a fourteenth embodiment of the present invention.

FIG. 20 is a circuit configuration diagram of a radio circuit apparatus 20 according to a fourteenth embodiment of the present invention. In FIG. 20, the radio circuit apparatus 20 includes an antenna 201, a duplexer 202, a low-noise amplifier 203, filters 204 and 217, a demodulator 205, a modulator 206, a power amplifier 207, oscillators 208 and 209, local signal amplifiers 210 and 211, a level detection circuit 218, and a control circuit 215.

As can be seen in FIG. 20, the radio circuit apparatus 20 according to the fourteenth embodiment is different from the radio circuit apparatus 18 according to the thirteenth embodiment in that the control of the receiving circuit side by the control circuit 215 is performed dynamically based on two reception power levels detected by the level detection circuit 218. The detection of the two power levels enables control based on the ratio of an interference wave to a desired wave, which cannot be performed by the radio circuit apparatus 18.

The control by the level detection circuit 218 and the control circuit 215 is performed as follows. The dynamic range of the receiving circuit is most needed when the interference wave is large and the desired wave is small. In view of this, in the radio circuit apparatus 20, the level detection circuit 218 detects a total power level and a power level. The total power level, Ptotal, is of a desired wave and an interference wave before being inputted to the demodulator 205. The power level, Pdesire, is of only the desired wave after having been inputted to the demodulator 205 and the filter 217 which passes low frequencies. The level detection circuit 218 then compares the two power levels. Subsequently, the control circuit 215 increases the consumption current of the receiving circuit such that the higher the power level of the interference wave compared to the power level of the desired wave, the more the consumption current of the receiving circuit is increased.

Figure 21A:
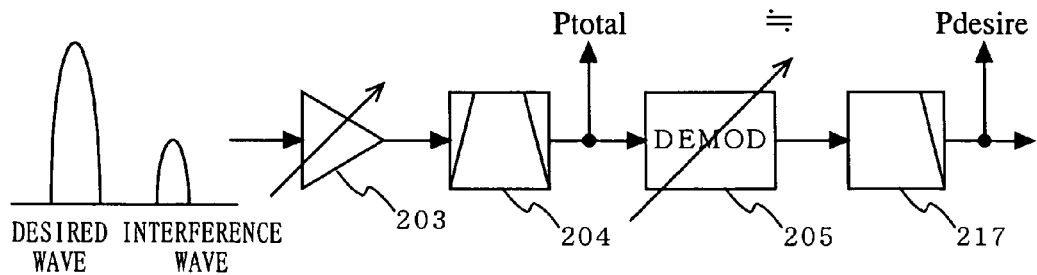
FIGS. 21A to 21D are diagrams for describing a control performed by the radio circuit apparatus.
Figure 21B:
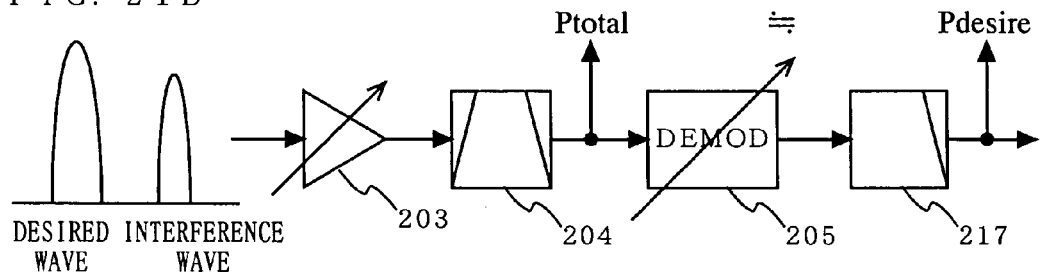

FIGS. 21A to 21D are diagrams showing the relationship between the power levels of the desired and interference waves of an inputted receive signal, and the current value to be controlled. FIG. 21A is a diagram showing the case where the power level of the desired wave is much higher than the power level of the interference wave. FIG. 21B is a diagram showing the case where the power level of the desired wave is a bit higher than the power level of the interference wave. In the two cases, the amplification process is performed based on the power level of the desired wave. Therefore, the level detection circuit 218 detects the total power level Ptotal outputted from the filter 204 and the power level Pdesire outputted from the filter 217 such that the total power level Ptotal and the power level Pdesire are substantially equal to each other (Ptotal≈Pdesire). Thus, when this level relationship is detected, the control circuit 215 controls the consumption current of the receiving circuit to be lower than normal.

Figure 21C:
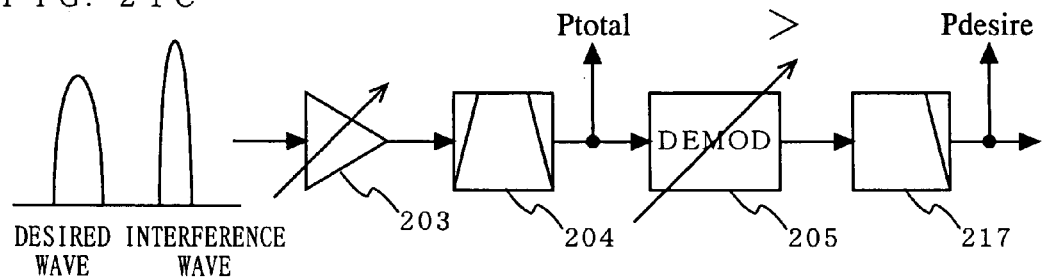

FIG. 21C is a diagram showing the case where the power level of the desired wave is a bit lower than the power level of the interference wave. In this case, the amplification process is performed based on the power level of the interference wave, and therefore the level detection circuit 218 detects the total power level Ptotal outputted from the filter 204 and the power level Pdesire outputted from the filter 217 such that the total power level Ptotal is a bit higher than the power level Pdesire (Ptotal>Pdesire). Thus, when this level relationship is detected, the control circuit 215 controls the consumption current of the receiving circuit to be normal.

Figure 21D:
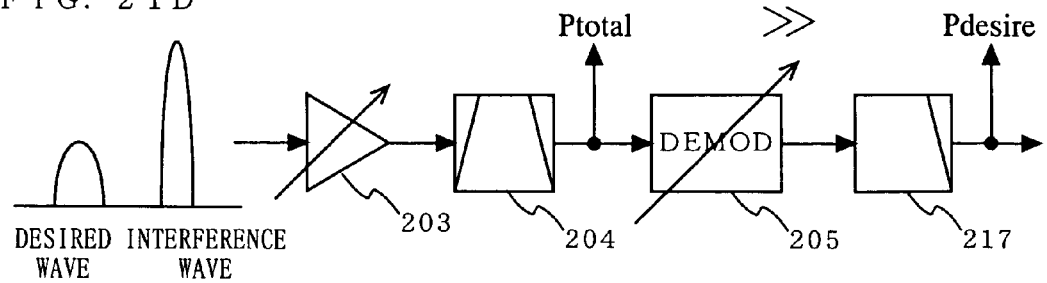
Figure 22:
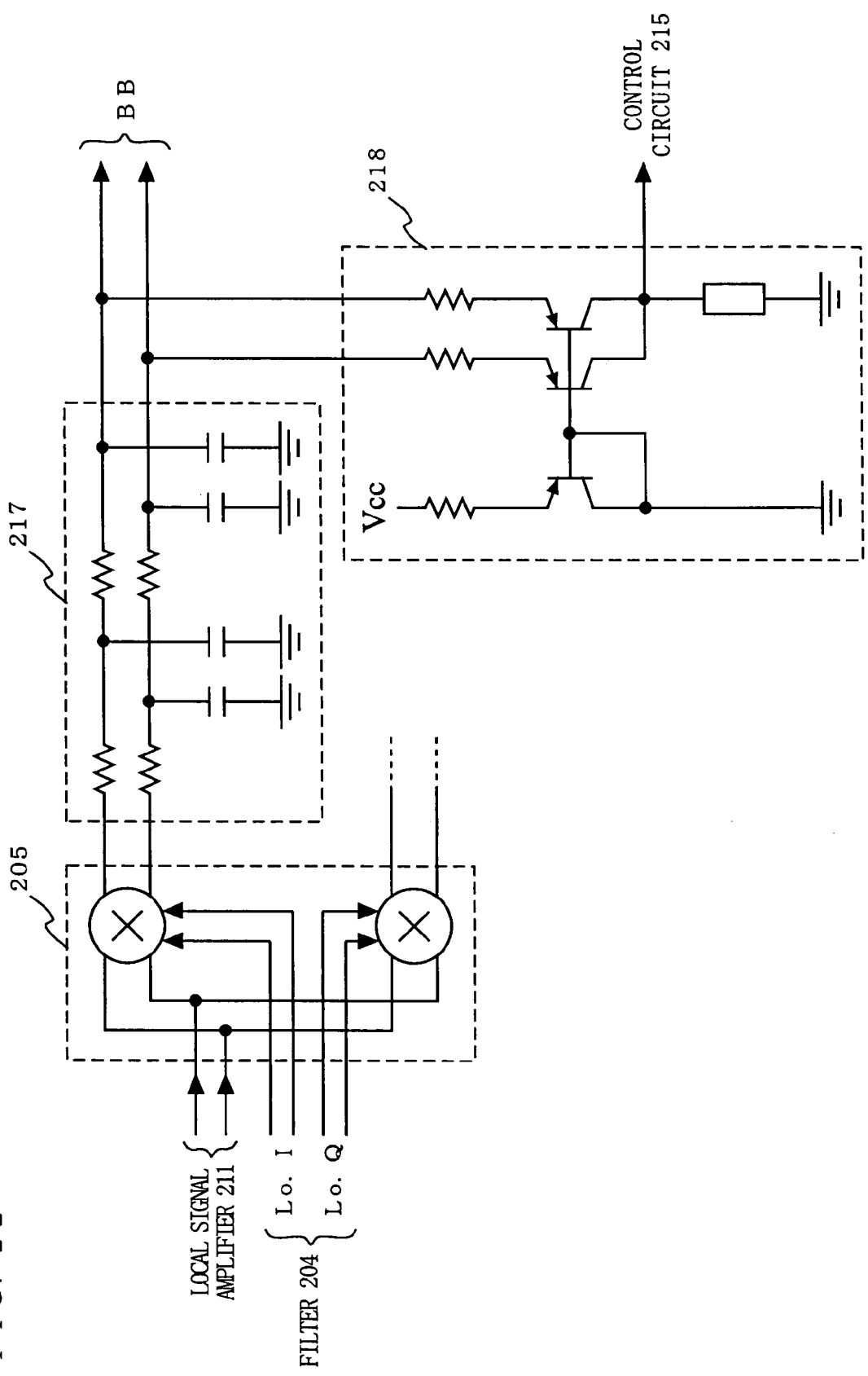
FIG. 22 is a circuit configuration diagram of a level detection circuit included in the radio circuit apparatus.
Figure 23:
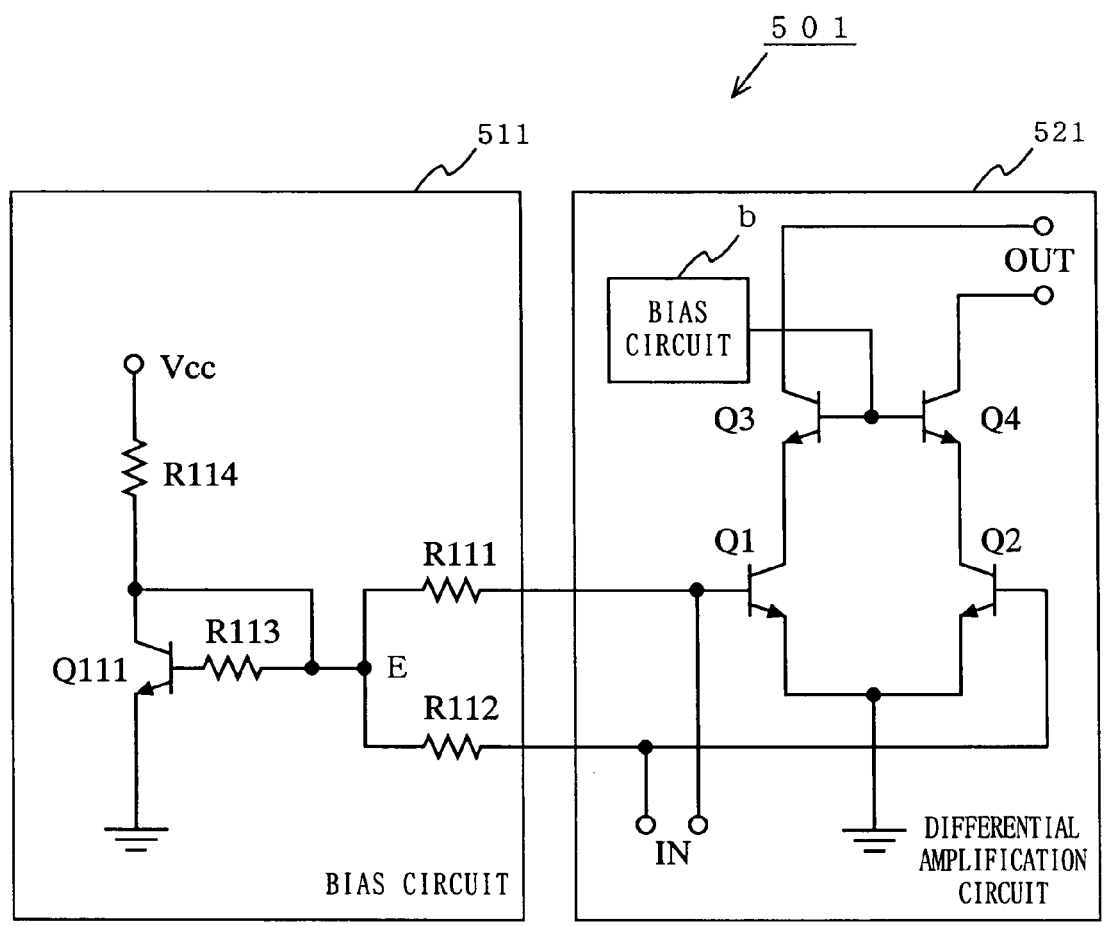
FIG. 23 is a circuit configuration diagram of a conventional differential signal processing apparatus.
Figure 24:
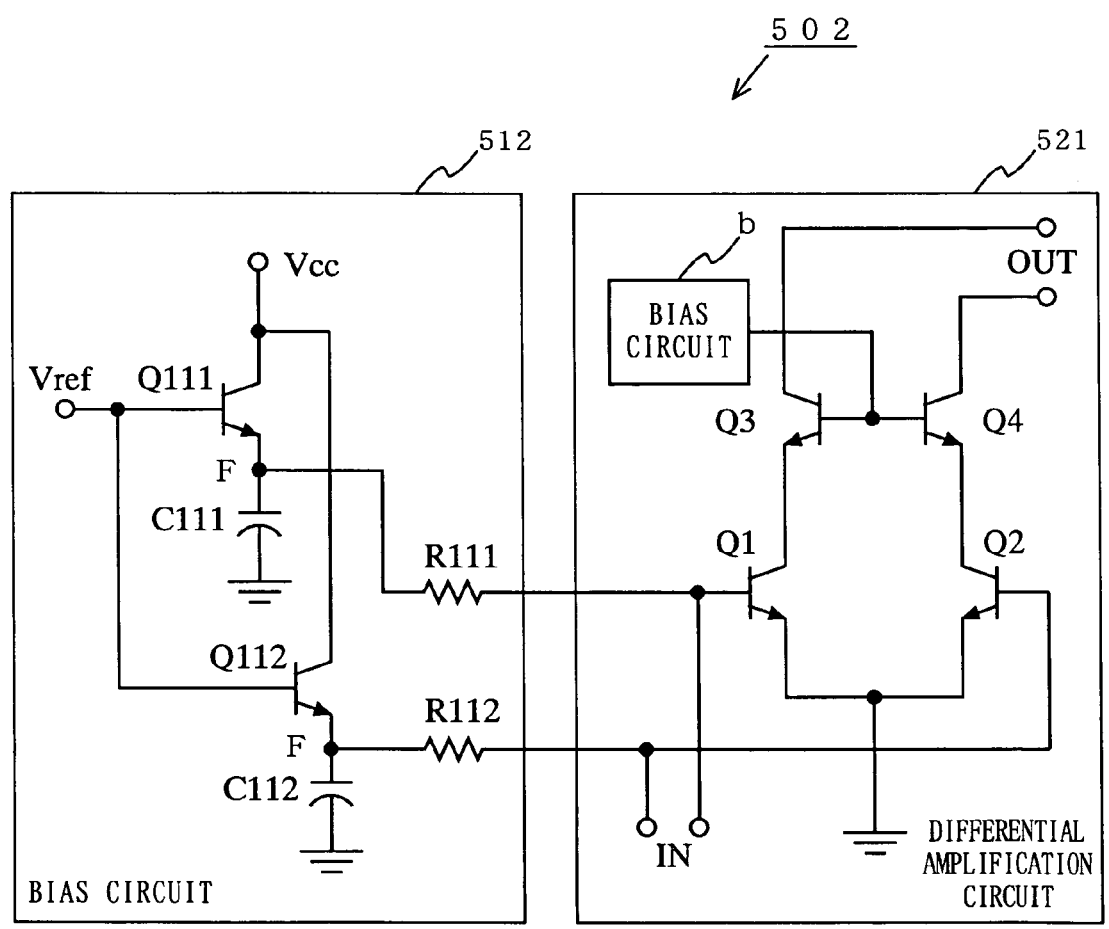
FIG. 24 is a circuit configuration diagram of a conventional differential signal processing apparatus.

FIG. 21D is a diagram showing the case where the power level of the desired wave is much lower than the power level of the interference wave. In this case, the amplification process is performed based on the power level of the interference wave, and therefore the level detection circuit 218 detects the total power level Ptotal outputted from the filter 204 and the power level Pdesire outputted from the filter 217 such that the power level Ptotal is much higher than the power level Pdesire (Ptotal>>Pdesire). Thus, when this level relationship is detected, the control circuit 215 controls the consumption current of the receiving circuit to be higher than normal. FIG. 22 is a circuit configuration diagram of the level detection circuit 218 included in the radio circuit apparatus 20.

As described in the fourteenth embodiment, by applying any of the differential signal processing apparatuses according to the first to ninth embodiments to the configuration of the radio circuit apparatus 20, a radio circuit apparatus can be realized which reduces the influence of a transmission power leakage based on the ratio of the interference wave to the desired wave of the receive signal, and provides a wide dynamic range (i.e., low noise and low distortion).

While the invention has been described in detail, the foregoing description is in all aspects illustrative and not restrictive. It is understood that numerous other modifications and variations can be devised without departing from the scope of the invention.

What is claimed is:

1. A low-noise differential bias circuit for supplying a low-noise bias current to bases or gates of a pair of differential transistors, the low-noise differential bias circuit comprising:
   a first resistor having a first end being connected to a base or gate of one of the pair of differential transistors;
   a second resistor having a first end being connected to a base or gate of another one of the pair of differential transistors;
   a third resistor having a first end being connected to a second end of the first resistor;
   a fourth resistor having a first end being connected to a second end of the second resistor;
   a first transistor, a second end of the third resistor being connected to a base or gate of the first transistor; and
   a second transistor, a second end of the fourth resistor being connected to a base or gate of the second transistor, wherein
   a direct-current voltage is supplied to a connection point between the first resistor and the third resistor, another connection point between the second resistor and the fourth resistor, a collector or drain of the first transistor, and a collector or drain of the second transistor, from a voltage supply point through a ground element that includes:
   a fifth resistor connecting the collector or drain of the first transistor to the voltage supply point;
   a sixth resistor connecting the collector or drain of the second transistor to the voltage supply point;
   a third transistor, a base or gate of the third transistor being connected to the collector or drain of the first transistor, and an emitter or source of the third transistor being connected to the connection point between the first resistor and the third resistor;
   a fourth transistor, a base or gate of the fourth transistor being connected to the collector or drain of the second transistor, and an emitter or source of the fourth transistor being connected to the other connection point between the second resistor and the fourth resistor;
   a first capacitor connecting the collector or drain of the first transistor to an emitter or source of the first transistor; and
   a second capacitor connecting the collector or drain of the second transistor to an emitter or source of the second transistor.

2. A low-noise differential bias circuit for supplying a low-noise bias current to bases or gates of a pair of differential transistors, the low-noise differential bias circuit comprising:
   a first resistor having a first end being connected to a base or gate of one of the pair of differential transistors;
   a second resistor having a first end being connected to a base or gate of another one of the pair of differential transistors;
   a third resistor having a first end being connected to a second end of the first resistor;
   a fourth resistor having a first end being connected to a second end of the second resistor;
   a first transistor, a second end of the third resistor being connected to a base or gate of the first transistor; and
   a second transistor, a second end of the fourth resistor being connected to a base or gate of the second transistor, wherein:
   a direct-current voltage is supplied to a connection point between the first resistor and the third resistor, another connection point between the second resistor and the fourth resistor, a collector or drain of the first transistor, and a collector or drain of the second transistor, from a voltage supply point through a ground element;
   the first and second transistors are selected from the group consisting of a PNP bipolar transistor and a P-channel MOS field-effect transistor; and
   an emitter or source of each of the first and second transistors is connected to the voltage supply point via a resistor.

3. A low-noise differential bias circuit for supplying a low-noise bias current to bases or gates of a pair of differential transistors, the low-noise differential bias circuit comprising:
   a first resistor having a first end being connected to a base or gate of one of the pair of differential transistors;
   a second resistor having a first end being connected to a base or gate of another one of the pair of differential transistors;
   a third resistor having a first end being connected to a second end of the first resistor;
   a fourth resistor having a first end being connected to a second end of the second resistor;
   a first transistor, a second end of the third resistor being connected to a base or gate of the first transistor; and
   a second transistor, a second end of the fourth resistor being connected to a base or gate of the second transistor, wherein:
   a direct-current voltage is supplied to a connection point between the first resistor and the third resistor, another connection point between the second resistor and the fourth resistor, a collector or drain of the first transistor, and a collector or drain of the second transistor, from a voltage supply point through a ground element;
   the first and second transistors are selected from the group consisting of a PNP bipolar transistor and a P-channel MOS field-effect transistor; and
   an emitter or source of each of the first and second transistors is connected to the voltage supply point via an inductor.

4. A differential signal processing apparatus comprising a low-noise differential bias circuit for generating a low-noise bias current, and a differential signal processing circuit for performing predetermined differential signal processing, wherein
   the low-noise differential bias circuit includes:
   a first resistor;
   a second resistor;
   a third resistor having a first end being connected to a first end of the first resistor;
   a fourth resistor having a first end being connected to a first end of the second resistor;
   a first transistor, a second end of the third resistor being connected to a base or gate of the first transistor; and
   a second transistor, a second end of the fourth resistor being connected to a base or gate of the second transistor, wherein
   a direct-current voltage is supplied to a connection point between the first resistor and the third resistor, another connection point between the second resistor and the fourth resistor, a collector or drain of the first transistor, and a collector or drain of the second transistor, from a voltage supply point through a ground element, and
   the differential signal processing circuit performs the predetermined differential signal processing using a bias current supplied from a second end of each of the first resistor and the second resistor;

the differential signal processing circuit includes:
a third transistor, the second end of the first resistor being connected to a base or gate of the third transistor, an emitter or source of the third transistor being grounded at high frequencies; and
a fourth transistor, the second end of the second resistor being connected to a base or gate of the fourth transistor, an emitter or source of the fourth transistor being grounded at high frequencies, wherein
the third and fourth transistors amplify signals differentially inputted to the bases or gates thereof, and then output the amplified signals from collectors or drains thereof;
the ground element includes:
a fifth resistor connecting the collector or drain of the first transistor and the collector or drain of the second transistor to the voltage supply point;
a fifth transistor, a base or gate of the fifth transistor being connected to the collector or drain of the first transistor, and an emitter or source of the fifth transistor being connected to the connection point between the first resistor and the third resistor; and
a sixth transistor, a base or gate of the sixth transistor being connected to the collector or drain of the second transistor, and an emitter or source of the sixth transistor being connected to the other connection point between the second resistor and the fourth resistor.

5. The differential signal processing apparatus according to claim 4, wherein the fifth resistor comprises
a sixth resistor that connects the connection point between the first resistor and the third resistor and the collector or drain of the first transistor to the voltage supply point and
a seventh resistor that connects the other connection point between the second resistor and the fourth resistor and the collector or drain of the second transistor to the voltage supply point.

6. The differential signal processing apparatus according to claim 4, wherein the fifth resistor comprises:
a sixth resistor connecting the collector or drain of the first transistor to the voltage supply point;
a seventh resistor connecting the collector or drain of the second transistor to the voltage supply point; and
wherein the ground element further includes a first capacitor connecting the collector or drain of the first transistor to an emitter or source of the first transistor; and
a second capacitor connecting the collector or drain of the second transistor to an emitter or source of the second transistor.

7. The differential signal processing apparatus according to claim 4, wherein the first to fourth transistors are selected from the group consisting of an NPN bipolar transistor and an N-channel MOS field-effect transistor.

8. The differential signal processing apparatus according to claim 7, wherein the emitter or source of each of the first to fourth transistors is grounded.

9. The differential signal processing apparatus according to claim 7, wherein the emitter or source of each of the first to fourth transistors is grounded through a resistor.

10. The differential signal processing apparatus according to claim 7, wherein the emitter or source of each of the first to fourth transistors is grounded through an inductor.

11. The differential signal processing apparatus according to claim 4, wherein the first to fourth transistors are selected from the group consisting of a PNP bipolar transistor and a P-channel MOS field-effect transistor.

12. The differential signal processing apparatus according to claim 11, wherein the emitter or source of each of the first to fourth transistors is connected to the voltage supply point.

13. The differential signal processing apparatus according to claim 11, wherein the emitter or source of each of the first to fourth transistors is connected to the voltage supply point via a resistor.

14. The differential signal processing apparatus according to claim 11, wherein the emitter or source of each of the first to fourth transistors is connected to the voltage supply point via an inductor.

15. The differential signal processing apparatus according to claim 4, wherein a connection from the ground element to the voltage supply point or a ground point is established by a signal wire.

16. The differential signal processing apparatus according to claim 4, further comprising:
a seventh transistor, a predetermined potential being connected to a base or gate of the seventh transistor, the collector or drain of the third transistor being connected to an emitter or source of the seventh transistor; and
eighth transistor, the predetermined potential being connected to a base or gate of the eighth transistor, the collector or drain of the fourth transistor being connected to an emitter or source of the eighth transistor, wherein
signals differentially inputted to the bases or gates of the third and fourth transistors, respectively, are amplified and outputted from collectors or drains of the seventh and eighth transistors.

17. The differential signal processing apparatus according to claim 16, wherein
the collector or drain of the seventh transistor is connected to the base or gate of the third transistor via a first feedback circuit, and
the collector or drain of the eighth transistor is connected to the base or gate of the fourth transistor via a second feedback circuit.

18. The differential signal processing apparatus according to claim 17, wherein the first and second feedback circuits each are a series circuit including resistors connected in series.

19. The differential signal processing apparatus according to claim 17, wherein the first and second feedback circuits each are a parallel circuit including a resistor and a capacitor connected in parallel.

20. A radio circuit apparatus comprising:
a duplexer allowing use of an antenna for both transmission and reception;
a first oscillator using a first differential signal processing apparatus comprising a low-noise differential bias circuit for generating a low-noise bias current; and a differential signal processing circuit for performing predetermined differential signal processing, wherein
the low-noise differential bias circuit includes:
a first resistor;
a second resistor;
a third resistor having a first end being connected to a first end of the first resistor;
a fourth resistor having a first end being connected to a first end of the second resistor;
a first transistor, a second end of the third resistor being connected to a base or gate of the first transistor; and
a second transistor, a second end of the fourth resistor being connected to a base or gate of the second transistor, wherein
a direct-current voltage is supplied to a connection point between the first resistor and the third resistor, another connection point between the second resistor and the fourth resistor, a collector or drain of the first transistor, and a collector or drain of the second transistor, from a voltage supply point through a ground element, and the differential signal processing circuit performs the predetermined differential signal processing using a bias current supplied from a second end of each of the first resistor and the second resistor, and wherein the differential signal processing circuit includes:

a third transistor, the second end of the first resistor being connected to a base or gate of the third transistor, an emitter or source of the third transistor being grounded at high frequencies;

a fourth transistor, the second end of the second resistor being connected to a base or gate of the fourth transistor, and an emitter or source of the fourth transistor being grounded at high frequencies;

a first capacitor connecting the base or gate of the third transistor to a collector or drain of the fourth transistor; and a second capacitor connecting the base or gate of the fourth transistor to a collector or drain of the third transistor, and the emitter or source of each of the third and fourth transistors is grounded at high frequencies, and the third and fourth transistors output oscillated differential signals from the collectors or drains thereof;

a first amplifier using a second differential signal processing apparatus of claim 4, the first amplifier amplifying a receive signal to be outputted from the duplexer;

a demodulator using a third differential signal processing apparatus comprising a demodulator low-noise differential bias circuit for generating a low-noise bias current; and a demodulator differential signal processing circuit for performing predetermined differential signal processing, wherein the demodulator low-noise differential bias circuit includes:

a fifth resistor;

a sixth resistor;

a seventh resistor having a first end being connected to a first end of the fifth resistor;

an eighth resistor having a first end being connected to a first end of the sixth resistor;

a fifth transistor, a second end of the seventh resistor being connected to a base or gate of the fifth transistor; and a sixth transistor, a second end of the eighth resistor being connected to a base or gate of the sixth transistor, wherein a direct-current voltage is supplied to a connection point between the fifth resistor and the seventh resistor, a connection point between the sixth resistor and the eighth resistor, a collector or drain of the fifth transistor, and a collector or drain of the sixth transistor, from a voltage supply point through a ground element, and the differential signal processing circuit performs the predetermined differential signal processing using a bias current supplied from a second end of each of the fifth resistor and the sixth resistor, wherein the demodulator differential signal processing circuit includes:

a seventh transistor, the second end of the fifth resistor being connected to a base or gate of the seventh transistor; and an eighth transistor, the second end of the sixth resistor being connected to a base or gate of the eighth transistor, an emitter or source of the eighth transistor being connected to an emitter or source of the seventh transistor, and the seventh and eighth transistors allow a first signal to be inputted to the emitter or source thereof, allow second signals to be differentially inputted to the bases or gates thereof, mix the first and second signals, and then output the mixed signal from a collector or drain thereof, and wherein the demodulator differential signal processing circuit further includes:

a ninth transistor, the second end of the sixth resistor being connected to a base or gate of the ninth transistor; and a tenth transistor, the second end of the fifth resistor being connected to a base or gate of the tenth transistor, an emitter or base of the tenth transistor being connected to an emitter or source of the ninth transistor, and the ninth and tenth transistors allow the first signal to be inputted in reverse phase to the emitter or source thereof, allow the second signals to be differentially inputted to the bases or gates thereof, mix the first signal in reverse phase with the second signals, and then output the mixed signals from collectors or drains thereof, the demodulator demodulating an amplified receive signal using a first oscillator signal generated in the first oscillator;

a second oscillator using the first differential signal processing apparatus;

a modulator using the third differential signal processing apparatus, the modulator modulating a transmit signal using a signal generated in the second oscillator; and a second amplifier using the second differential signal processing apparatus, the second amplifier amplifying the transmit signal outputted from the modulator and then outputting the amplified transmit signal to the duplexer.

21. The radio circuit apparatus according to claim 20, further comprising a control circuit for controlling, when a signal is transmitted, the second amplifier, the second oscillator, and the modulator to increase a transmission power of the transmit signal, and also controlling the first amplifier, the first oscillator, and the demodulator to increase consumption currents of the first amplifier, the first oscillator, and the demodulator.

22. The radio circuit apparatus according to claim 20, further comprising a control circuit for controlling, when a signal is not transmitted, the second amplifier, the second oscillator, and the modulator to reduce a transmission power of the transmit signal, and also controlling the first amplifier, the first oscillator, and the demodulator to reduce consumption currents of the first amplifier, the first oscillator, and the demodulator.

23. The radio circuit apparatus according to claim 20, further comprising:

a coupler for extracting a part of the amplified transmit signal outputted from the second amplifier;

a level detection circuit for detecting a power level of an extracted transmit signal; and a control circuit for changing consumption currents of the first amplifier, the first oscillator, and the demodulator based on a detected power level, wherein the control circuit controls the consumption currents of the first amplifier, the first oscillator, and the demodulator such that the consumption currents increase as the detected power level increases.

24. The radio circuit apparatus according to claim 20, further comprising:

a coupler for extracting a part of the amplified transmit signal outputted from the second amplifier;

a level detection circuit for detecting a power level of an extracted transmit signal; and a control circuit for changing consumption currents of the first amplifier, the first oscillator, and the demodulator based on an detected power level, wherein the control circuit controls the consumption currents of the first amplifier, the first oscillator, and the demodulator such that the consumption currents decrease as the detected power level decreases.

25. The radio circuit apparatus according to claim 20, further comprising:
a level detection circuit for allowing the amplified receive signal outputted from the first amplifier to be inputted thereto, and then detecting a power level of the receive signal; and
a control circuit for changing consumption currents of the first amplifier, the first oscillator, and the demodulator based on a detected power level, wherein
the control circuit controls the consumption currents of the first amplifier, the first oscillator, and the demodulator such that the consumption currents increase as the detected power level increases.

26. The radio circuit apparatus according to claim 20, further comprising:
a level detection circuit for allowing the amplified receive signal outputted from the first amplifier to be inputted thereto, and then detecting a power level of the receive signal; and
a control circuit for changing consumption currents of the first amplifier, the first oscillator, and the demodulator based on a detected power level, wherein
the control circuit controls the consumption currents of the first amplifier, the first oscillator, and the demodulator such that the consumption currents decrease as the detected power level decreases.

27. The radio circuit apparatus according to claim 20, further comprising:
a level detection circuit for allowing the amplified receive signal outputted from the first amplifier and a receive signal outputted from the demodulator to be inputted thereto, and then detecting and comparing power levels of the amplified receive signal and the receive signal outputted from the demodulator; and
a control circuit for changing consumption currents of the first amplifier, the first oscillator, and the demodulator based on a power level difference obtained through the comparison of the amplified receive signal and the receive signal outputted from the demodulator, wherein
the control circuit controls the consumption currents of the first amplifier, the first oscillator, and the demodulator such that the consumption currents increase as the power level difference increases.

28. The radio circuit apparatus according to claim 20, further comprising:
a level detection circuit for allowing the amplified receive signal outputted from the first amplifier and the receive signal outputted from the demodulator to be inputted thereto, and then detecting and comparing power levels of the amplified receive signal and the receive signal outputted from the demodulator; and
a control circuit for changing consumption currents of the first amplifier, the first oscillator, and the demodulator based on a power level difference obtained through the comparison of the amplified receive signal and the receive signal outputted from the demodulator, wherein
the control circuit controls the consumption currents of the first amplifier, the first oscillator, and the demodulator such that the consumption currents decrease as the power level difference decreases.

29. A differential signal processing apparatus comprising a low-noise differential bias circuit for generating a low-noise bias current; and a differential signal processing circuit for performing predetermined differential signal processing, wherein
the low-noise differential bias circuit includes:
a first resistor;
a second resistor;
a third resistor having a first end being connected to a first end of the first resistor;
a fourth resistor having a first end being connected to a first end of the second resistor;
a first transistor, a second end of the third resistor being connected to a base or gate of the first transistor;
a second transistor, a second end of the fourth resistor being connected to a base or gate of the second transistor, wherein
a direct-current voltage is supplied to a connection point between the first resistor and the third resistor, a connection point between the second resistor and the fourth resistor, a collector or drain of the first transistor, and a collector or drain of the second transistor, from a voltage supply point through a ground element, and
the differential signal processing circuit performs the predetermined differential signal processing using a bias current supplied from a second end of each of the first resistor and the second resistor;
the differential signal processing circuit includes:
a third transistor, the second end of the first resistor being connected to a base or gate of the third transistor;
a fourth transistor, the second end of the second resistor being connected to a base or gate of the fourth transistor, an emitter or source of the fourth transistor being connected to an emitter or source of the third transistor, and
the third and fourth transistors allow a first signal to be inputted to the emitter or source thereof, allow second signals to be differentially inputted to the bases or gates thereof, mix the first and second signals, and then output the mixed signal from a collector or drain thereof;
a fifth transistor, the second end of the second resistor being connected to a base or gate of the fifth transistor; and
a sixth transistor, the second end of the first resistor being connected to a base or gate of the sixth transistor, an emitter or source of the sixth transistor being connected to an emitter or source of the fifth transistor, and
the fifth and sixth transistors allow the first signal to be inputted in reverse phase to the emitter or source thereof, allow the second signals to be differentially inputted to the bases or gates thereof, mix the first signal in reverse phase and the second signals, and then output the mixed signals from collectors or drains thereof.

* * * * *